United States Patent
Liaw

(10) Patent No.: US 11,031,397 B2
(45) Date of Patent: Jun. 8, 2021

(54) MULTI-GATE DEVICE INTEGRATION WITH SEPARATED FIN-LIKE FIELD EFFECT TRANSISTOR CELLS AND GATE-ALL-AROUND TRANSISTOR CELLS

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/524,430

(22) Filed: Jul. 29, 2019

(65) Prior Publication Data

US 2020/0105761 A1 Apr. 2, 2020

Related U.S. Application Data

(60) Provisional application No. 62/737,613, filed on Sep. 27, 2018.

(51) Int. Cl.
*H01L 27/092* (2006.01)
*H01L 21/8238* (2006.01)
(Continued)

(52) U.S. Cl.
CPC .... *H01L 27/0924* (2013.01); *H01L 21/02603* (2013.01); *H01L 21/823807* (2013.01); *H01L 21/823814* (2013.01); *H01L 21/823821* (2013.01); *H01L 21/823878* (2013.01); *H01L 29/42392* (2013.01); *H01L 29/66545* (2013.01);
(Continued)

(58) Field of Classification Search
CPC ..... H01L 21/823821; H01L 21/823807; H01L 21/823814; H01L 21/02603; H01L 21/823878; H01L 21/823431; H01L 21/823412; H01L 27/0924; H01L 27/0207; H01L 27/092; H01L 27/088; H01L 27/0886; H01L 29/66545; H01L 29/42392; H01L 29/66795; H01L 29/785;
(Continued)

(56) References Cited

U.S. PATENT DOCUMENTS 9,236,267 B2 1/2016 De et al.
9,236,300 B2 1/2016 Liaw
9,520,482 B1 12/2016 Chang et al.
9,576,814 B2 2/2017 Wu et al.
(Continued)

*Primary Examiner* — Herve-Louis Y Assouman
(74) *Attorney, Agent, or Firm* — Haynes and Boone, LLP

(57) ABSTRACT

Integrated circuit having an integration layout and the manufacturing method thereof are disclosed herein. An exemplary integrated circuit (IC) comprises a first cell including one or more first type gate-all-around (GAA) transistors located in a first region of the integrated circuit; a second cell including one or more second type GAA transistors located in the first region of the integrated circuit, wherein the second cell is disposed adjacently to the first cell, wherein the first type GAA transistors are one of nanosheet transistors or nanowire transistors and the second type GAA transistors are the other one of nanosheet transistors or nanowire transistors; and a third cell including one or more fin-like field effect transistors (FinFETs) located in a second region of the integrated circuit, wherein the second region is disposed a distance from the first region of the integrated circuit.

20 Claims, 15 Drawing Sheets

(51) Int. Cl.
  *H01L 29/66* (2006.01)
  *H01L 21/02* (2006.01)
  *H01L 29/423* (2006.01)
  *H01L 29/78* (2006.01)
  *H01L 29/775* (2006.01)
  *H01L 21/8234* (2006.01)
  *H01L 27/02* (2006.01)
  *H01L 27/088* (2006.01)

(52) U.S. Cl.
  CPC ...... *H01L 29/66795* (2013.01); *H01L 29/785* (2013.01)

(58) Field of Classification Search
  CPC . H01L 29/665; H01L 29/7848; H01L 29/775; H01L 29/78696
  See application file for complete search history.

(56) References Cited

U.S. PATENT DOCUMENTS

| | | |
|---|---|---|
| 9,613,953 B2 | 4/2017 | Liaw |
| 9,793,273 B2 | 10/2017 | Liaw |
| 9,805,985 B2 | 10/2017 | Liaw |
| 9,853,114 B1 * | 12/2017 | Rodder ................ H01L 29/785 |
| 10,490,559 B1 * | 11/2019 | Ando .................... H01L 29/401 |
| 2009/0261423 A1 * | 10/2009 | Sawada ................ H01L 29/785 |
| | | 257/392 |
| 2013/0105897 A1 * | 5/2013 | Bangsaruntip ...... H01L 27/1211 |
| | | 257/351 |
| 2013/0270620 A1 * | 10/2013 | Hu ...................... H01L 29/7851 |
| | | 257/296 |
| 2014/0043060 A1 * | 2/2014 | Amaru ................ H03K 19/215 |
| | | 326/36 |
| 2017/0255735 A1 * | 9/2017 | Kim ................ H01L 21/823821 |
| 2017/0256611 A1 * | 9/2017 | Kim ................ H01L 29/775 |
| 2017/0278842 A1 * | 9/2017 | Song ............... H01L 21/823431 |

* cited by examiner

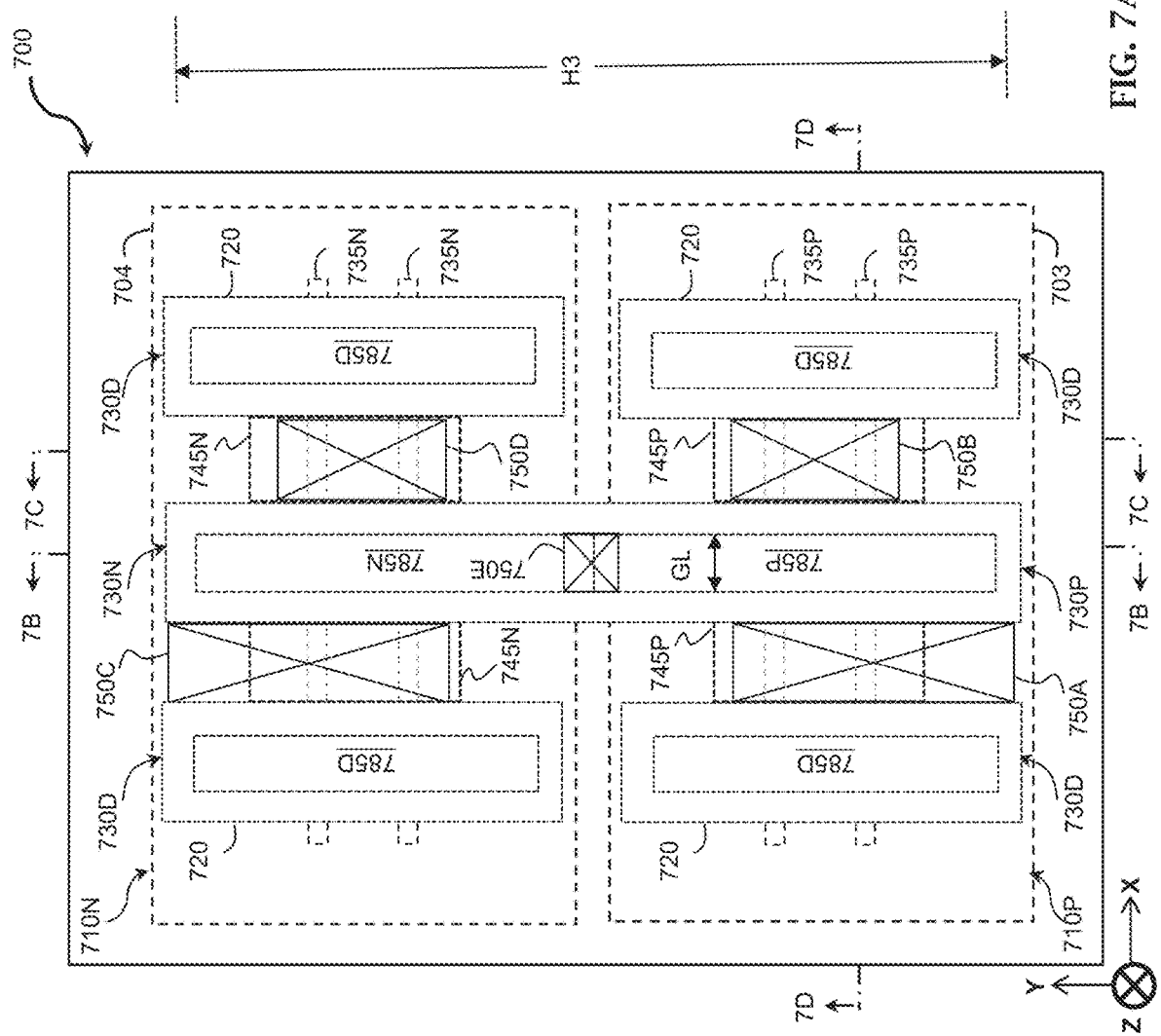

MULTI-GATE DEVICE INTEGRATION WITH SEPARATED FIN-LIKE FIELD EFFECT TRANSISTOR CELLS AND GATE-ALL-AROUND TRANSISTOR CELLS

This is a non-provisional application of and claims benefit of U.S. Provisional Patent Application Ser. No. 62/737,613, filed Sep. 27, 2018, the entire disclosure of which is incorporated herein by reference.

BACKGROUND

The present disclosure is generally related to integrated circuit, and more particularly, to multi-gate device integration for optimizing integrated circuit performance. As integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor (for example, a Nanosheet transistor or a Nanowire transistor) has a gate structure that can extend, partially or fully, around a channel region to provide access to the channel region on two or more sides. The channel region of the GAA transistor may be formed from Nanowires, Nanosheets, other nanostructures, and/or other suitable structures. However, integration of different multi-gate devices (including FinFETS, Nanowire and/or Nanosheet transistors) on one integrated circuit is challenging and complex. Lots of factors need to be considered to achieve a better performance of the integrated circuit with different kind of multi-gate devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 7A-7D are simplified schematic figures of a cell including a plurality of FinFET devices that may be formed in a core area or an I/O area of a semiconductor device, according to various aspects of the present disclosure.

DETAILED DESCRIPTION

Figure 1:
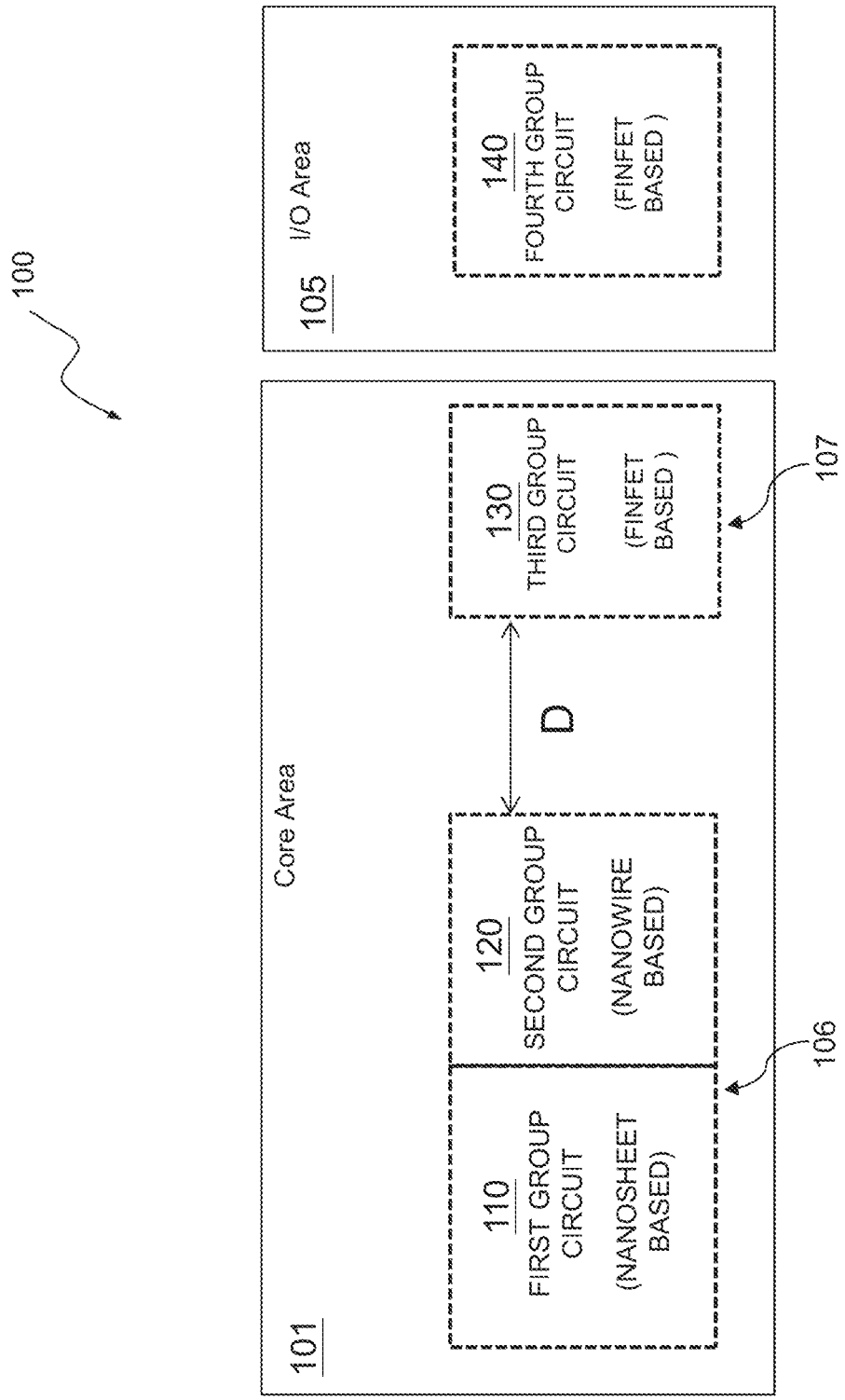
FIG. 1 is a schematic figure of a semiconductor device comprising different types of multi-gate transistors, according to various aspects of the present disclosure.

The present disclosure relates generally to integrated circuit (IC) devices, and more particularly, to multi-gate device integration for IC devices.

The following disclosure provides many different implementations, or examples, for implementing different features of the invention. Specific examples of components and arrangements are described below to simplify the present disclosure. These are, of course, merely examples and are not intended to be limiting. For example, the formation of a first feature over or on a second feature in the description that follows may include implementations in which the first and second features are formed in direct contact, and may also include implementations in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various implementations and/or configurations discussed. Moreover, the formation of a feature on, connected to, and/or coupled to another feature in the present disclosure that follows may include implementations in which the features are formed in direct contact, and may also include implementations in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

For advanced IC technology nodes, FinFET (also referred to as non-planar transistors) has become a popular and promising candidate for high performance and low leakage applications. This is due to additional sidewalls device width (Ion performance) as well as better short channel control (subthreshold leakage) of the FinFET. However, FinFET devices have fin bottom portion out of gate control issue, which limits the continue shrunk capability of the device. Thus, GAA devices are proposed as advantageous since GAA devices allow more aggressive gate length scaling for both performance and density improvement. GAA devices can be nanowire or nanosheet devices that can exhibit extremely narrow cylindrical or sheet channel body. GAA can also have better gate control ability, lower leakage current, and shrink capability in comparison with some FinFET devices. Nanowire devices have smaller channel regions and can serve for non-speed critical circuit to have both lower leakage and power consumption (both active and standby) advantages. Nanosheet devices have wider channel width which may be beneficial for high speed circuits. A design providing a mixture of both devices, nanowire and nanosheet, in one chip can provide design flexibility for speed and power optimization. In addition, using long channel devices in a design, such as FinFET devices, can help with the process margin improvement for the device.

However, challenges can arise in fabricating various types of devices (e.g., GAA nanosheet and nanowire devices as well as FinFETs, in a single semiconductor device (e.g., integrated circuit) on a single substrate. For example, the dimensional differences create processing challenges integrating the device types. As but one example, in some embodiments, in processes directed to oxidation of a feature due to the increased dimensions of elements to form the wider-channel Nanosheet devices, an oxidation process sufficient to perform the oxidation of the Nanowire device but may be insufficient for forming Nanosheet devices or conversely providing sufficient oxidation in forming a Nanosheet device may lead to an over oxidation issue for Nanowire devices. Some embodiments of the proposed multi-gate devices and methods of fabricating these devices in this disclosure provides an IC device layout that can combine the advantages of different transistors, including Nanowire transistors, Nanosheet transistors and FinFETs, as well as mitigating the manufacturing issues that mentioned above. Different implementations may have different advantages, and no particular advantage is necessarily required of any implementation.

FIG. 1 is a schematic figure of an integrated circuit (IC) 100, in portion or entirety, according to various aspects of the present disclosure. The IC 100 may include a plurality of multi-gate devices or transistors, a multi-gate device generally refers to any transistor where the gate controls more than one surface of the channel such as, a FinFET or GAA based device. The IC 100 may be a chip providing functionality for a microprocessor, a memory cell, and/or other IC device. In some embodiments, the IC 100 is a portion of an IC chip, a system on chip (SoC), or portion thereof, that includes various passive and active microelectronic devices, such as resistors, capacitors, inductors, diodes, P-type field effect transistors (PFETs), N-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof.

The IC 100 comprises a core area 101 and an Input/Output (I/O) area 105. The core area 101 and the I/O area 105 may be areas of a device formed on a single semiconductor substrate. Core area 101 comprises three kinds of group of circuit, i.e. first group circuit 110 (e.g., cell) including one or more Nanosheet transistors (also referred to as a Nanosheet cell), second group circuit 120 (e.g., cell) including one or more Nanowire transistors (also referred to as a Nanowire cell), and third group circuit 130 (e.g., cell) including one or more FinFETs (also referred to as a FinFET cell). These circuits or cells are exemplary only and the device 100 may include any number of cells.

In an embodiment, all transistors of the first group circuit 110 are Nanosheet transistors, and all transistors of second group circuit 120 are Nanowire transistors. In the depicted embodiments, the first group circuit 110 and the second group circuit 120 are disposed adjacently and formed in a GAA region 106 in the core area 101. In some embodiments, the first group circuit 110 and the second group circuit 120 may be disposed mixed in different rows and columns of a layout (for example, FIG. 2). In some other embodiments, the first group circuit 110 and the second group circuit 120 may be arranged in different rows and/or columns, respectively (for example, FIG. 3). In yet some other embodiments, one of the group circuit 110 or 120 is arranged in one row (i.e. not including the other group circuit), and mixed group circuits 110 and 120 are arranged in a next row. In an embodiment, the first group circuit 110 and the second group circuit 120 may be swapped, for example, the first group circuit 110 (e.g., NS cell) may be nearer the third group circuit and interposing the second group circuit 120 and the third group circuit. Different layout options of the first group circuit 110 and the second group circuit 120 are discussed in the following figures, for example, FIGS. 2-4 and FIGS. 5A-6C. In the depicted embodiments, all transistors of the third group circuit 130 are FinFETs. The third group circuit 130 including FinFETs is located in a FinFET region 107 in the core area 101 and is separate from the first group circuit 110 including Nanosheet transistors and the second group circuit 120 including Nanowire transistor. Exemplary embodiment of the third group circuit 130 is provided in FIGS. 7A-7D.

Figure 5A:
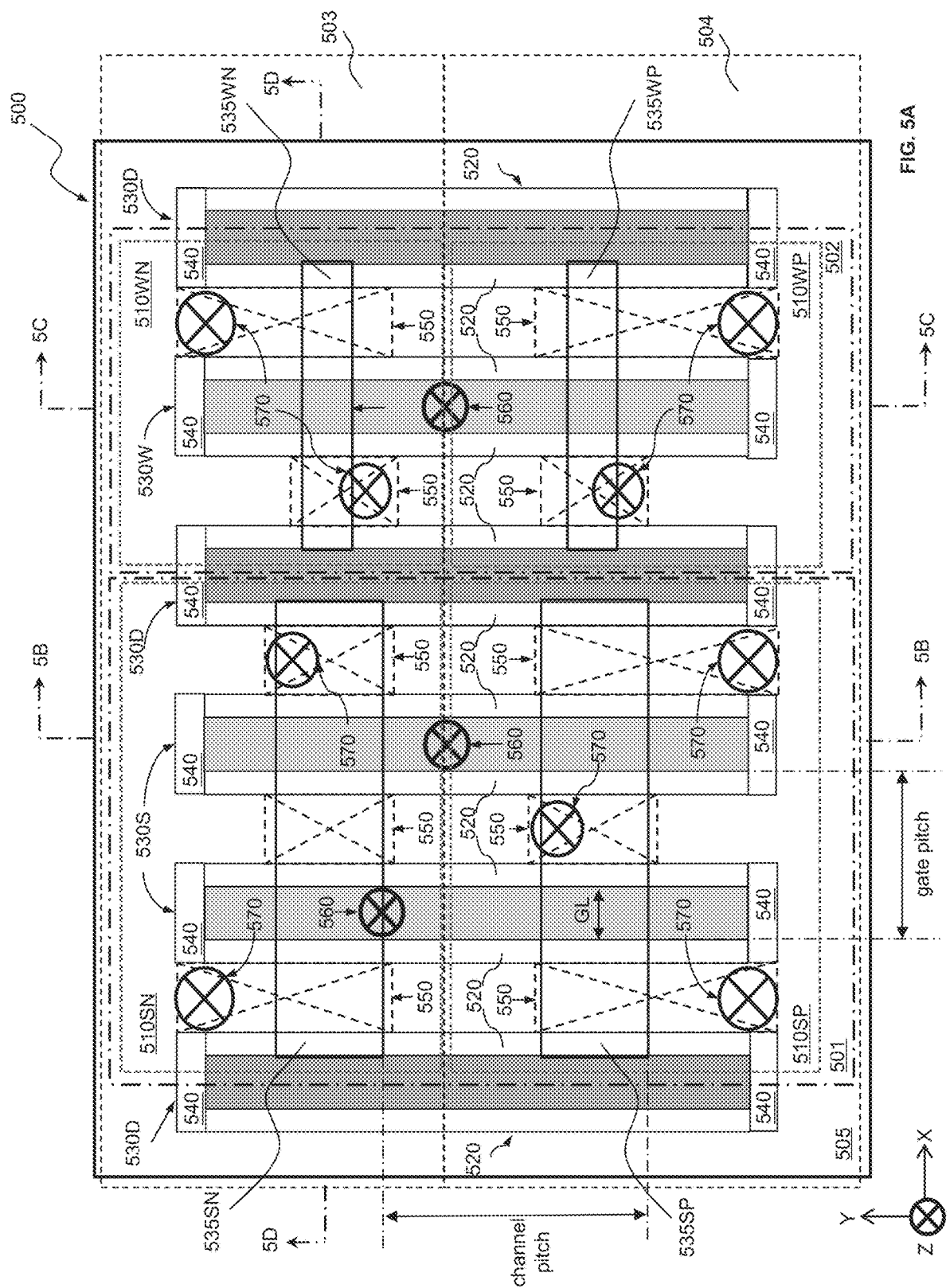
FIGS. 5A-5D are simplified schematic figures of a cell including a plurality of GAA devices according to one layout option, according to various aspects of the present disclosure.

In some embodiments, a distance D between the closest boundaries of the FinFET region 107 (including the third group FinFET circuit 130) and the GAA region 106 (including the first group Nanosheet circuit 110 and second group Nanowire circuit 120) is at least four (4) times of the contact poly pitch (CPP, i.e. gate pitch), at least four (4) times of the channel pitch distance, or at least four times of both. Here, the gate pitch is the gate pitch of the GAA transistors included in the first or second group circuit 110 or 120 and the channel pitch is the channel pitch of the GAA transistors included in the first or second group circuit 110 or 120. An example gate pitch and an example channel pitch are illustrated in FIG. 5A as the edge-to-edge distance between two adjacent gates and the edge-to-edge distance between two adjacent channels, respectively. The gate pitch and the channel pitch can be defined using center-to-center distance instead of edge-to-edge distance in some embodiments. In some embodiments, in the region of distance D, it may be fully empty without any semiconductor features. In some embodiments, isolation structures including features such as dummy gate structures and/or dummy gate contacts, may be formed between the GAA region 106 and the FinFET region 107 (in the region of distance D) for gate patterning uniformity, loading effect improvement, and/or following interlayer dielectric (ILD) and chemical mechanical polishing (CMP) topography. Here, the dummy gate structures or the dummy gate contacts generally refer to electrically non-functional structures that only formed in place for process uniformity or active regions isolation. Thus, in some embodiments, in the region of distance D there are no functional or operational semiconductor devices (e.g., there are no functional gate structures).

The I/O area 105 of the IC 100 comprises a fourth group circuit 140 including one or more FinFETs. In an embodiment, all transistors of the fourth group circuit 140 are FinFETs. In an embodiment, one of the differences between the FinFETs in the fourth group circuit 140 in the I/O area 105 and the FinFETs in the third group circuit 130 in the core area 101 is that a thickness of the gate dielectric layer of the FinFETs in the fourth group circuit 140 in the I/O area 105 is larger than that of the third group circuit 130 in the core area 101. In a further embodiment, the gate dielectric layer thickness of the FinFETs in the third group circuit 130 is substantially the same as that of the GAA transistors in the first group circuit 110 and/or the second group circuit 120 in the core area 101. In some embodiments, a thickness of the gate dielectric layer of transistors in the first, second and third group circuits 110-130 in the core area 101 is less than about 3 nanometers (nm); a thickness of the gate dielectric of transistors of the fourth group circuit 140 in the I/O area 105 is more than about 4 nm. Various processing is contemplated for achieving the different gate dielectric thicknesses.

Figure 6A:
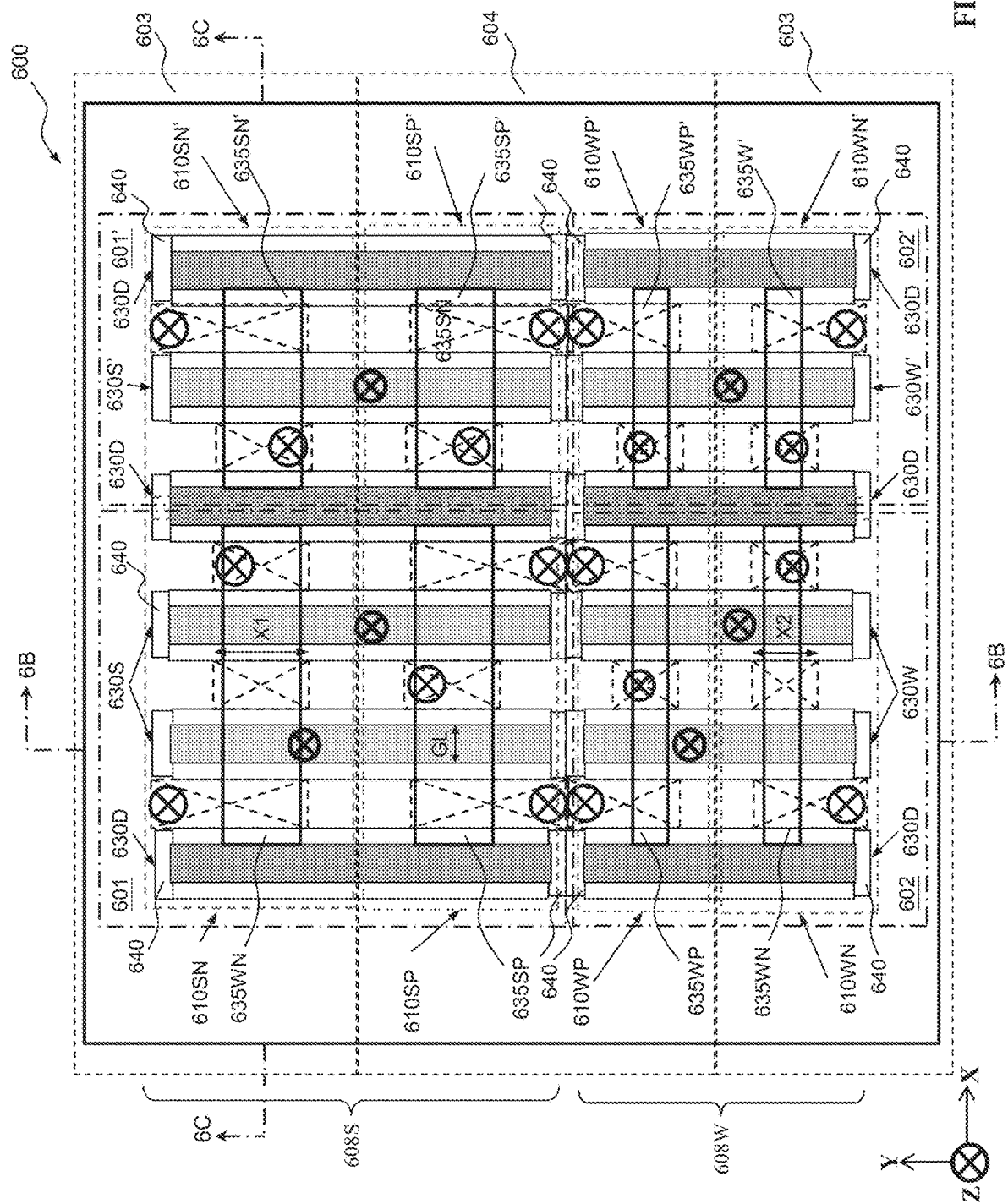
FIGS. 6A-6C are simplified schematic figures of another cell including a plurality of GAA devices according to another layout option, according to various aspects of the present disclosure.

Long channel devices (FinFETs) and short channel devices (GAA transistors) may have different gate lengths in the x-direction between the source/drain regions, for example, the gate length GL in the x-direction as depicted in FIGS. 5A and 6A for GAA transistors, or the gate length GL in the x-direction as depicted in FIG. 7A for FinFET.) In some embodiments, a gate length of FinFETs in the third group circuit 130 and FinFETs in the fourth group circuit 140 is greater than a gate length of Nanosheet transistors in the first group circuit 110 and/or is greater than a gate length of Nanowire transistors in the second group circuit 120. For example, a gate length of Nanosheet transistors or Nanowire transistors of circuits 110 and 120 is less than 20 nm, a gate length of the FinFETs of circuits 130 is larger than 30 nm. Accordingly, a gate length ratio of FinFETs to Nanosheet or Nanowire transistors is greater than about 1.5.

Figure 2:
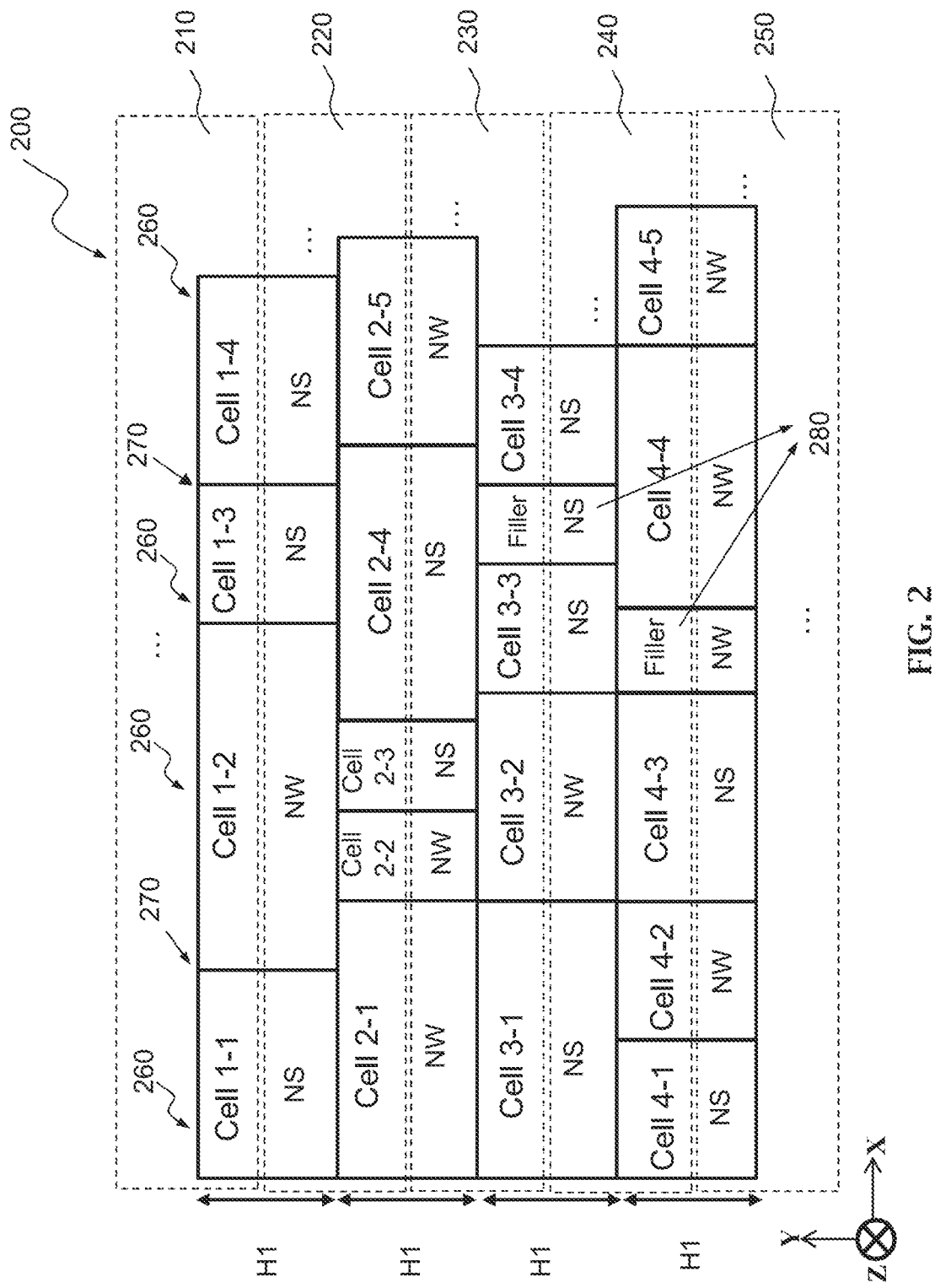
FIG. 2 is a simplified schematic top view of a first layout option of a semiconductor device including multi-gate devices, according to various aspects of the present disclosure.
Figure 3:
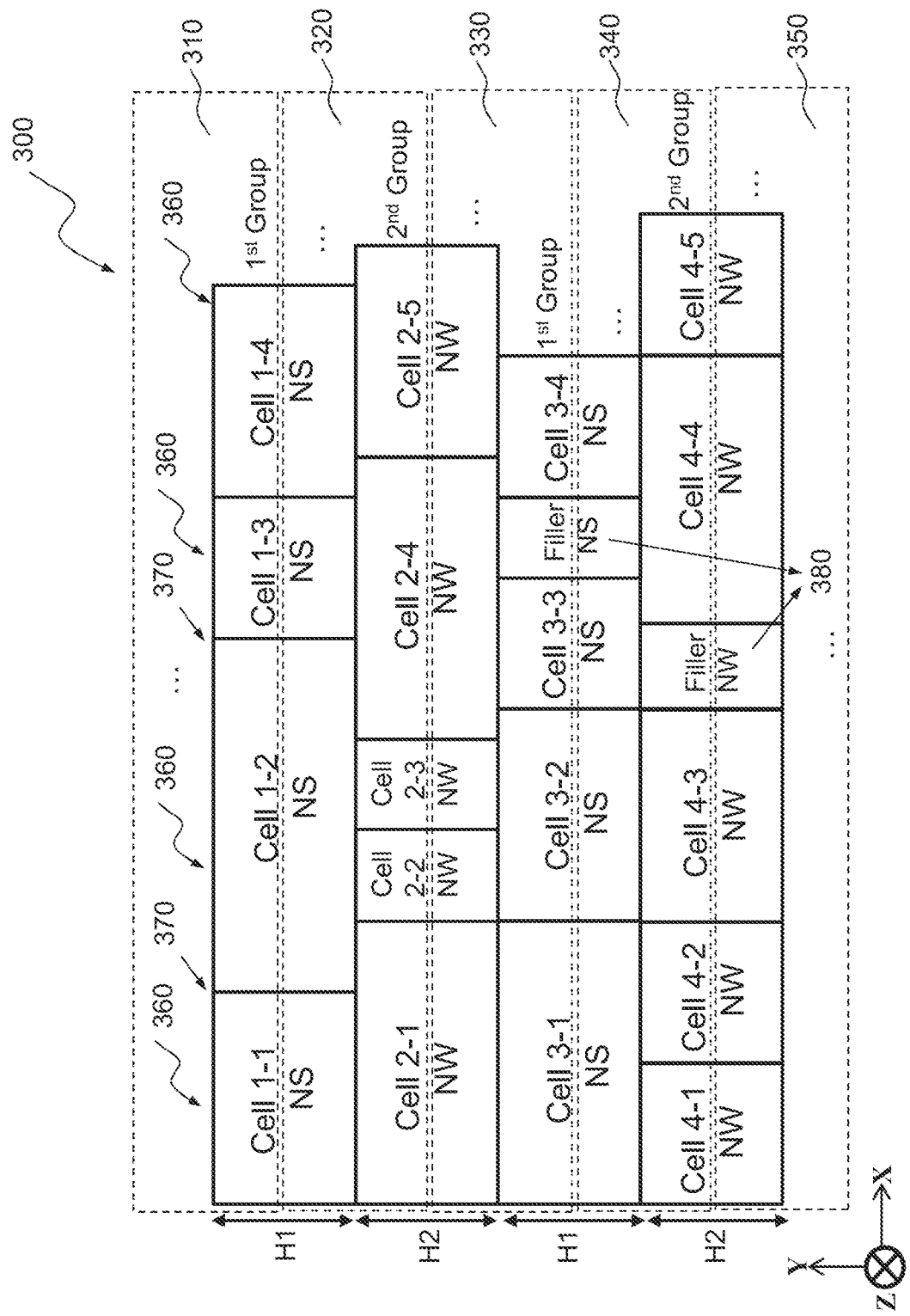
FIG. 3 is a simplified schematic top view of a second layout option of a semiconductor device including multi-gate devices, according to various aspects of the present disclosure.
Figure 4:
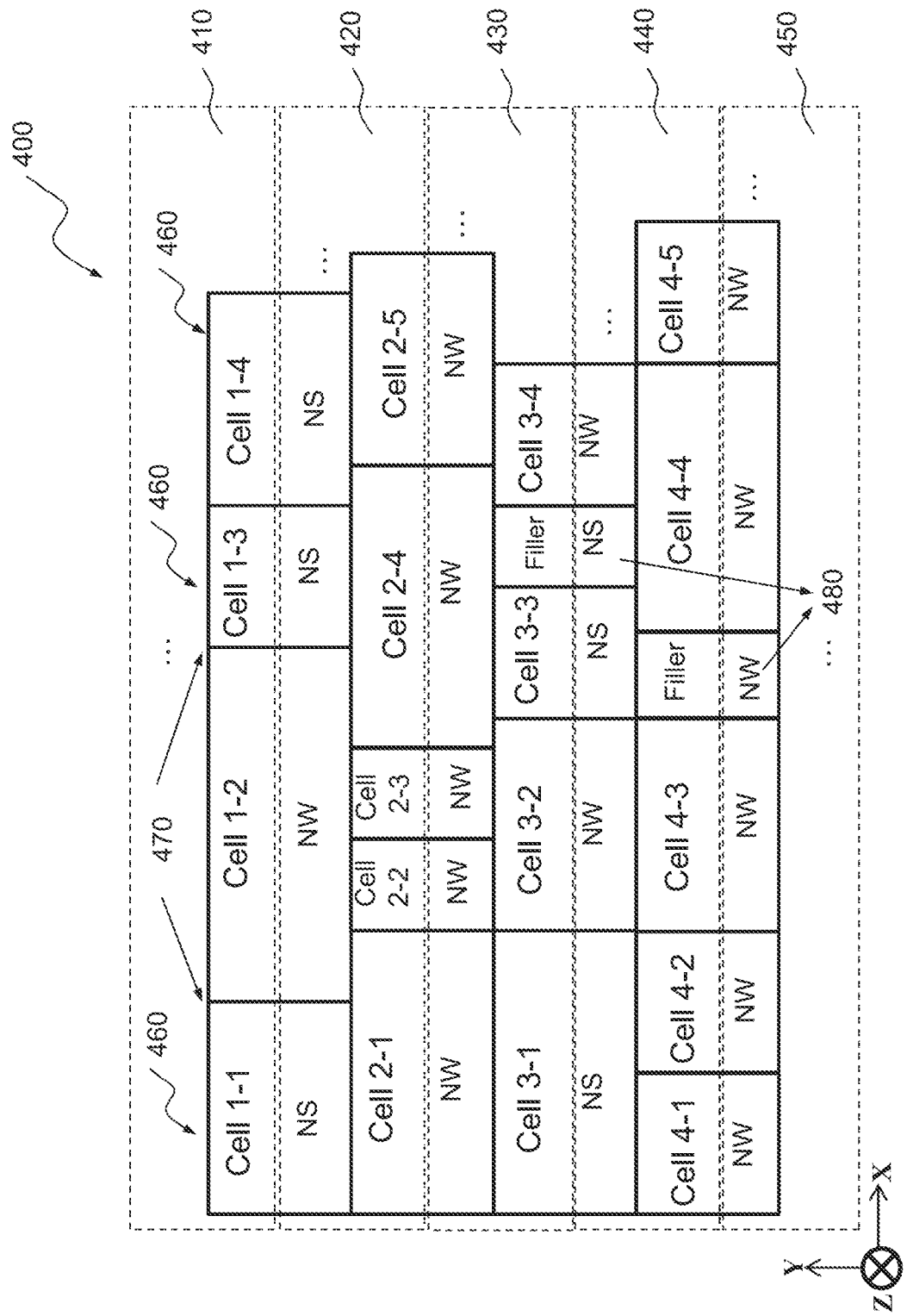
FIG. 4 is a simplified schematic top view of a third layout option of a semiconductor device including multi-gate devices according to various aspects of the present disclosure.

FIGS. 2-4 are simplified schematic top view of different layout options for the core area 101 of the IC 100 of FIG. 1 including embodiments of the first group circuit 110 (Nanosheet cell) and the second group circuit 120 (Nanowire cell) in the IC 100. FIGS. 2-4 provide example layouts that may be applied to the core area 101 of the IC 100 of FIG. 1. In an embodiment, FIGS. 2-4 illustrate exemplary embodiments of a first group circuit 110 and abutting second group circuit 120 where a distance D is defined from an edge of one of the cells of FIGS. 2-4 as illustrated in FIG. 1.

FIG. 2 is a simplified schematic top view of a first layout option 200 (for example, in an x-y plane) of Nanosheet cells (labeled NS) and Nanowire cells (labeled NW) (both referred to as GAA cells) formed in the GAA region 106 in the core area 101 of the IC 100. As discussed above, the GAA region 106 is separated from the FinFET region 107 for a distance D. Layout 200 comprises a plurality of GAA cells (first or second group circuits) 260. Each GAA cell 260 comprises one or more transistors that provide at least one circuit element. The GAA cells 260 may provide an example of the respective one of circuits 110 (NS) and/or 120 (NW) of FIG. 1. Exemplary circuit elements include an inverter, a NAND gate, a NOR gate, an AND gate, an OR gate, a NOT gate, an XOR gate, an XNOR gate, a Flip-Flop, a latch, or combinations thereof. Each GAA cell 260 may be a Nanosheet cell comprising one or more Nanosheet transistors or a Nanowire cell comprising one or more Nanowire transistors. In the depicted layout 200, Nanosheet cells (NS) and Nanowire cells (NW) are arranged in a row direction (x-direction) as well as in a column direction (y-direction) according to the design requirement of the IC 100, so that GAA cells 260 can be interconnected to form various circuits and functions performed by IC 100. In the depicted embodiment, at least one Nanosheet cell and at least one Nanowire cell are disposed adjacent to each other in the row direction, and at least a portion of a Nanosheet cell is abutted with at least a portion of a Nanowire cell in a column direction. Note that the number of GAA cells 260 (including Nanosheet cells and Nanowire cells) are not limited to those illustrated, and may extend or reduce in row and/or column directions. In the depicted embodiment, each GAA cell 260 is named by their row number and column number. For example, Cell 1-1 is the cell located in the first row and the first column; Cell 2-3 is the cell located in the second row and the third column; and so on. As depicted in FIG. 2, Cell 1-1 is a Nanosheet cell (illustrated as "NS"); Cell 1-2 is a Nanowire cell (illustrated as "NW"); Cell 1-3 is another Nanosheet cell (illustrated as "NS"); and so on. In each row of GAA cells 260, an isolation structure 270, for example a dielectric dummy gate structure, may be located between the different types of cells, i.e. between a Nanosheet cell and a Nanowire cell that adjacent next to each other. In the depicted embodiment, an isolation structure 270 is located between Nanosheet Cell 1-1 and Nanowire Cell 1-2; another isolation structure 270 is located between Nanosheet Cell 1-3 and Nanosheet Cell 1-4. Other isolation structures may be located between other adjacent cells, regardless if the adjacent cells are of the same type or different types to isolate the adjacent cells from each other. The isolation structures between cells in an array of cells may be the same or different. Exemplary isolation structures (for example, dummy gate structures 530D) are described below with reference to FIGS. 5A-5D. Among columns along the y-direction, GAA cells 260 are abutted together. A dielectric structure disposed at the gate end (i.e. gate end dielectric structure) may be used to isolate gate structures in GAA cells adjacent in different columns. Exemplary gate end dielectric structures (for example, gate end dielectric structures 540) are described below with reference to FIGS. 5A-5D. In the depicted embodiment of FIG. 2, each row of GAA cells 260 in layout 200 has a same height H1 along the y-direction.

In some embodiments, as depicted in FIG. 2, layout 200 comprises P-type doped regions (referred to as P-type wells) 210, 230 and 250 and N-type doped regions (referred to as N-type wells) 220 and 240. Each of these doped regions extend across different rows of GAA cells 260, thus providing a region for each type of transistor (n-type or p-type) within the given cell. In the depicted embodiment, N-doped region 220 extend across row 1 and row 2 of the GAA cells 260; P-doped region 230 extend across row 2 and row 3 of GAA cells 260; N-doped region 240 across row 3 and row 4 of GAA cells 260, and so on. In some embodiments, P-type doped regions 210, 230, and 250 are doped with P-type dopants, such as boron (for example, BF2), indium, other P-type dopant, or combinations thereof. N-type doped regions 220 and 240 are doped with N-type dopants, such as phosphorus, arsenic, other N-type dopant, or combinations thereof. An ion implantation process, a diffusion process, and/or other suitable doping process can be performed to form the various doped regions.

As depicted in FIG. 2, layout 200 may also comprises some filler cells 280 including Nanosheet or Nanowire transistors to fill up the gap between adjacent GAA cells 260 according to the design requirement of the IC 100. In some embodiments, filler cells 280 may provide at least one circuit element. In some other embodiments, filler cells 280 may only be dummy features and do not provide any circuit element function.

FIG. 3 is a simplified schematic top view of a second layout option 300 (for example, in an x-y plane) of Nanosheet cells and Nanowire cells (both referred to as GAA cells) formed in the GAA region 106 in the core area 101 of the IC 100. As discussed above, the GAA region 106 is separated from the FinFET region 107 for a distance D. Layout 300 comprises a plurality of GAA cells (first or second group circuits) 360. Note that the number of GAA cells 360 are not limited to those illustrated and may extend or reduce in row and/or column directions. Each GAA cell 360 comprises one or more transistors that provide at least one circuit element. Exemplary circuit elements include an inverter, a NAND gate, a NOR gate, an AND gate, an OR gate, a NOT gate, an XOR gate, an XNOR gate, a Flip-Flop, a latch, or combinations thereof. Each of GAA cells 360 may be a Nanosheet cell comprising one or more Nanosheet transistors or a Nanowire cell comprising one or more Nanowire transistors. In layout 300, Nanosheet cells and Nanowire cells are respectively arranged in different rows along the x-direction, and are vertically abutted together in the y-direction. In the depicted layout 300, in the first and third rows, all GAA cells are Nanosheet cells (corresponding to the first group circuit 110, illustrated as "NS"); in the second and fourth rows, all GAA cells are Nanowire cells (corresponding to the second group circuit 120, illustrated as "NW"). In this second layout option 300, an isolation structure 370 is formed between adjacent cells to isolate them from each other. A gate end spacer may be disposed to isolate gate structures of GAA transistors in GAA cells 360 abutted in the column direction. In some embodiments, the height of different rows of the GAA cells 360 may be different. In some other embodiments, the height of different rows of the GAA cells 360 may be the same. As depicted in FIG. 3, a height of the first and third rows including Nanosheet cells is H1 and a height of the second and fourth rows including Nanowire cells is H2. In some embodiments, the height H1 of the Nanosheet cells is greater than the height H2 of the Nanowire cells. In an embodiment, the width of a channel of a transistor comprised in the cells is oriented in the y-direction. As discussed above, the width of the channel of a Nanosheet transistor may be greater than the width of a channel of a Nanowire transistor. Thus, H1 may be greater than H2 to accommodate a width (e.g., along the y-direction) of the channel region of the Nanosheet transistors as it is greater than a width (along the y-direction) of the channel region of the Nanowire transistors (see, e.g., FIGS. 6A-6C and the illustrations of width W1 and the width W2). In some embodiments, the channel width of the nanosheet transistor is at least about 1.3 to 10 times of the channel width of the nanowire transistor. In some further embodiments, the channel width of the nanosheet transistor is about 1.4 to 5 times of the channel width of the nanowire transistor. For example, channel width of the Nanosheet transistors is about 12 nm to 40 nm and channel width of the Nanowire transistors is about 4 nm to 11 nm. Accordingly, the height H1 of Nanosheet cells is greater than the height H2 of Nanowire cells. However, in some other embodiments, H1 may be substantially equal to H2 or H1 may be less than H2 by adjusting size of other features (for example, gate dielectric layer or gate electrodes) of the cells 360, depending on the design requirements of the IC 100.

In some embodiments, layout 300 comprises P-type doped regions (referred to as P-type wells) 310, 330 and 350 and N-type doped regions (referred to as N-type wells) 320 and 340 across different rows of GAA cells 360. The components and manufacturing process of P-type doped regions 310, 330 and 350 and N-type doped regions 320 and 340 are similar to those of P-type doped regions 210, 230, 250, N-type doped regions 220 and 240 in layout 200, and thus are not repeated here.

Similar as layout 200, layout 300 may also comprise some filler cells 380 including Nanosheet or Nanowire transistors to fill up the gap between adjacent GAA cells 360 according to the design requirement of the IC 100. In some embodiments, filler cells 380 may provide at least one circuit element. In some other embodiments, filler cells 380 may only be placeholders and do not provide any circuit element function.

FIG. 4 is a simplified schematic top view of a third layout option 400 (for example, in an x-y plane) of Nanosheet cells and Nanowire cells (both referred to as GAA cells) formed in the GAA region 106 in the core area 101 of the IC 100. As discussed above, the GAA region 106 is separated from the FinFET region 107 for a distance D. Layout 400 comprises a plurality of GAA cells 460. Note that the number of GAA cells 460 are not limited to those illustrated and may extend or reduce in row and/or column directions. Each GAA cell 460 comprises one or more transistors that provide at least one circuit element. Exemplary circuit elements include an inverter, a NAND gate, a NOR gate, an AND gate, an OR gate, a NOT gate, an XOR gate, an XNOR gate, a Flip-Flop, a latch, or combinations thereof. Each of GAA cells 460 may be a Nanosheet cell comprising one or more Nanosheet transistors or a Nanowire cell comprising one or more Nanowire transistors. In the depicted third layout 400, Nanosheet cells and Nanowire cells are arranged in one row, and in a next (upper or lower) row, only one type of GAA cells 360, either Nanosheet cells or Nanosheet cells, are arranged. For example, as depicted in FIG. 4, Nanosheet cells and Nanowire cells are arranged in the first and third rows of layout 400. However, in the second and fourth rows, only Nanowire cells are arranged. In some other embodiments, the second row may only comprise one type of cells (for example, Nanowire cells) and the fourth row may only comprise another type of cells (for example, Nanosheet cells) (not illustrated). In the depicted third layout 400, an isolation structure 470, for example a dummy gate structure, is disposed between adjacent GAA cells 460 to separate and/or isolate the adjacent cells from each other. As discussed in FIG. 4, a height of each row of GAA cells 460 may be same or different depending on the design requirement of IC 100.

In some embodiments, layout 400 comprises P-type doped regions (referred to as P-type wells) 410, 430 and 450 and N-type doped regions (referred to as N-type wells) 420 and 440 across different rows of GAA cells 460. The components and manufacturing process of P-type doped regions 410, 430 and 40 and N-type doped regions 420 and 440 are similar to those of P-type doped regions and N-type doped regions in layout 200 and 300, and thus are not repeated here.

Similar to layouts 200 and 300, layout 400 may also comprises filler cells 480 including Nanosheet or Nanowire transistors to fill up the gap between adjacent GAA cells 460 according to the design requirement of the IC 100. In some embodiments, filler cells 480 may provide at least one circuit element. In some other embodiments, filler cells may only be dummy elements and do not provide any circuit element function.

FIGS. 5A-5D are simplified schematic figures of a device 500 comprising one or more circuit or cells including a Nanosheet cell 501 and a Nanowire cell 502. In the illustrated embodiment, the circuit 500 includes the Nanosheet cell 501 and the Nanowire cell 502 adjacent to each other such as illustrated by adjacent NS and NW cells in one row according to layout 200 or layout 400 shown in FIG. 2 or FIG. 4, respectively. For example, Nanosheet cell 501 may be an embodiment of a NS cell 1-1 and Nanowire cell 502 may be an embodiment of a NW cell 1-2 of layout 200 in FIG. 2; or, Nanosheet cell 501 may be an embodiment of NS cell 3-1 and Nanowire cell 502 may be an embodiment of NW cell 3-2 of layout 400 in FIG. 4. Device 500 may be located in a core area 101 of the IC 100 in FIG. 1. Different types of GAA cells may be referred to as different group circuit as shown in FIG. 1. For example, Nanosheet cell 501 may be an example of the first group Nanosheet circuit 110 and Nanowire cell 502 may be an example of the second group Nanowire circuit 120.

Figures 5B, 5C:
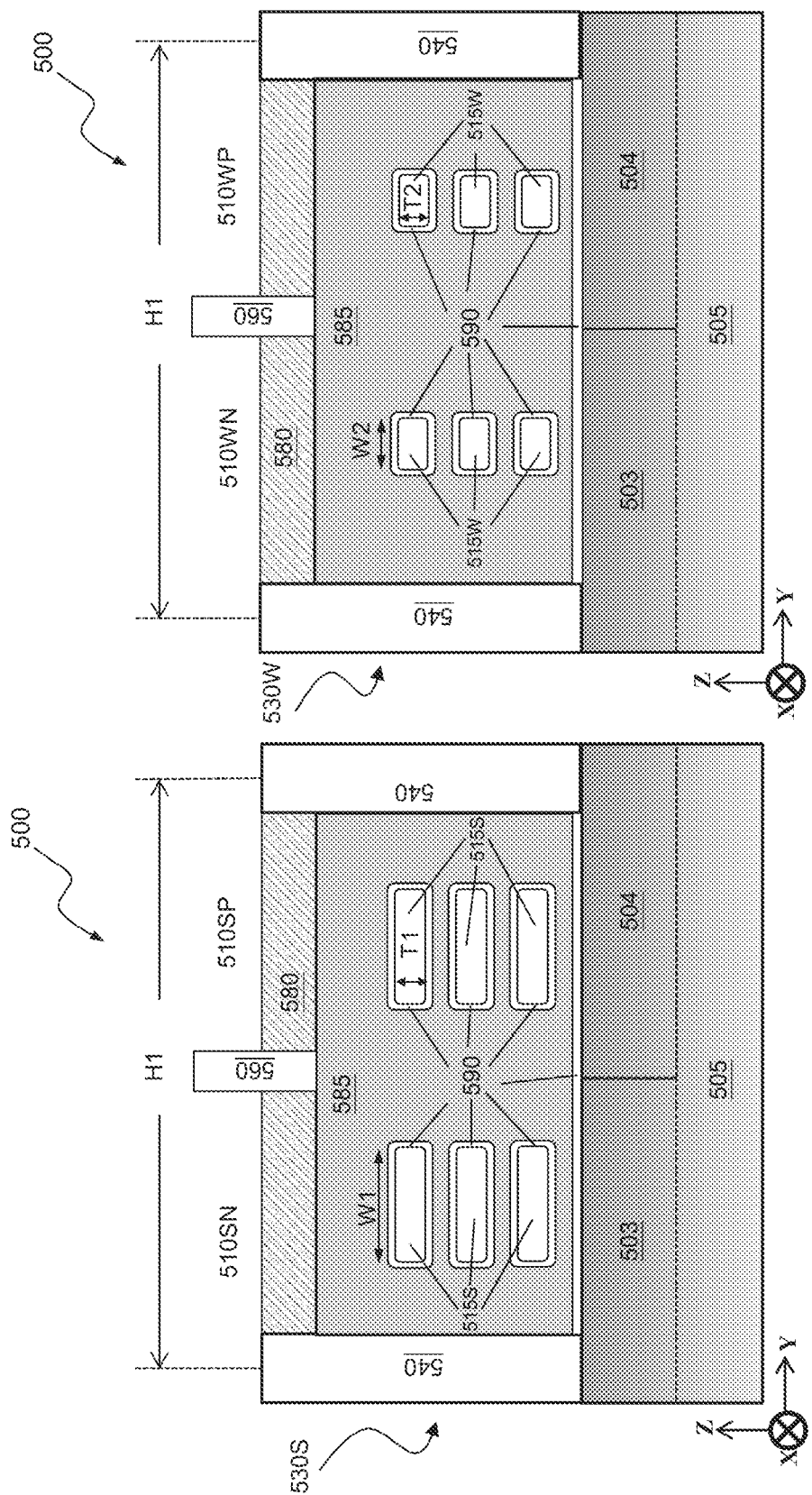
Figure 5D:
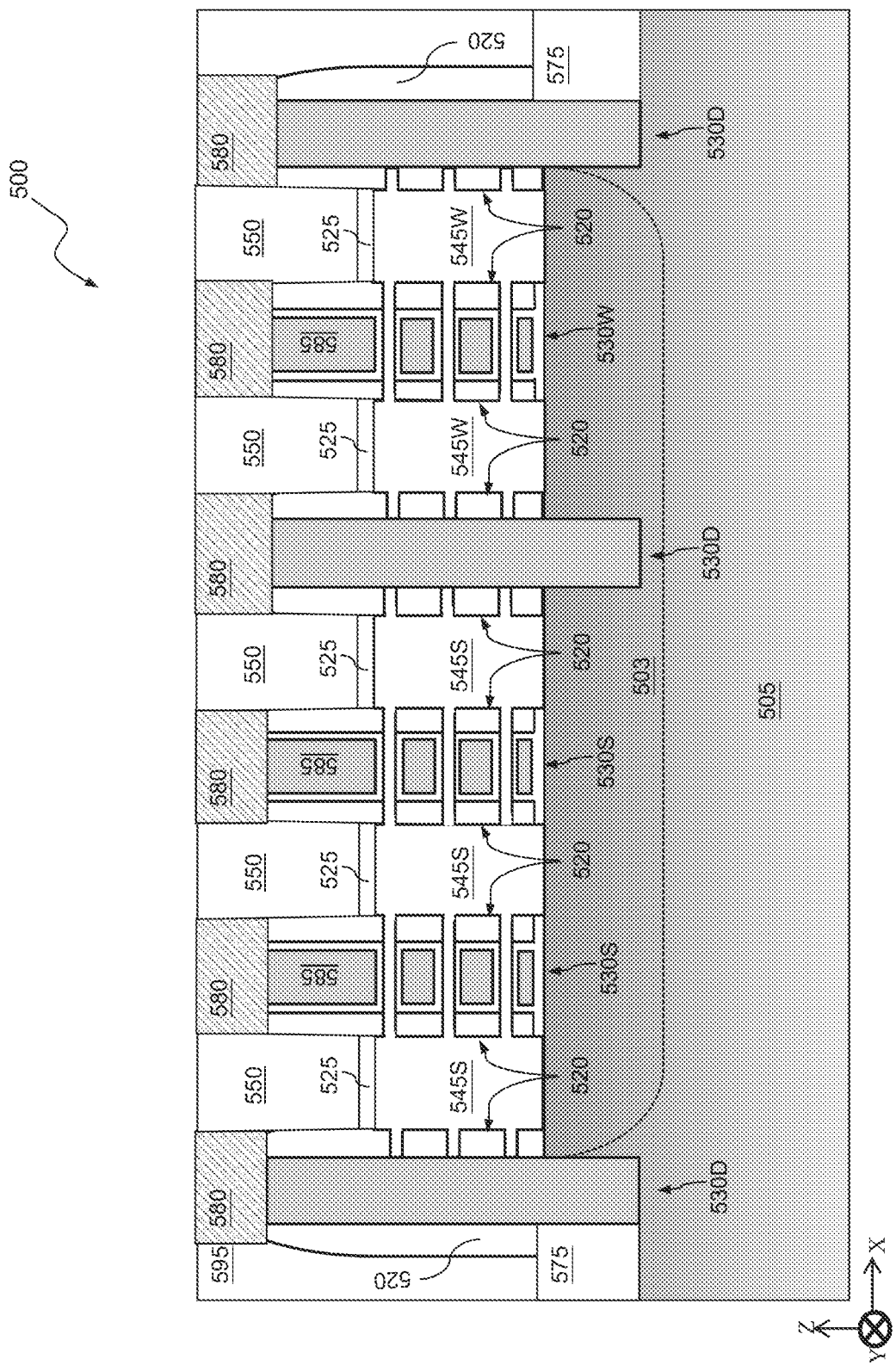

FIG. 5A is a simplified schematic top view of the device 500 (in an x-y plane); FIG. 5B is a diagrammatic cross-sectional view of device 500 along line 5B-5B of FIG. 5A (in a y-z plane); FIG. 5C is a diagrammatic cross-sectional view of device 500 along line 5C-5C of FIG. 5A (in a y-z plane); and FIG. 5D is a diagrammatic cross-sectional view of device 500 along line 5D-5D of FIG. 5A (in an x-z plane). FIGS. 5A-5D have been simplified for the sake of clarity to better understand the inventive concepts of the present disclosure. Additional features can be added in device 500, and some of the features described below can be replaced, modified, or eliminated in other embodiments of device 500.

Device 500 comprises a substrate (wafer) 505. In the depicted embodiment, substrate 505 includes silicon. Alternatively or additionally, substrate 505 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. Alternatively, substrate 505 is a semiconductor-on-insulator substrate, such as a silicon-on-insulator (SOI) substrate, a silicon germanium-on-insulator (SGOI) substrate, or a germanium-on-insulator (GOI) substrate. Further, the substrate 505 may optionally include an epitaxial layer, may be strained for performance enhancement, and/or have other suitable enhancement features.

Substrate 505 includes various doped regions configured according to design requirements of device 500. In some embodiments, substrate 505 includes P-type doped regions (for example, P-type wells 503) doped with P-type dopants, such as boron (for example, BF2), indium, other P-type dopant, or combinations thereof. In some embodiments, substrate 505 includes N-type doped regions (for example, N-type wells 504) doped with N-type dopants, such as phosphorus, arsenic, other N-type dopant, or combinations thereof. The various doped regions can be formed directly on and/or in substrate 505, for example, providing a P-well structure, an N-well structure, a dual-well structure, a raised structure, or combinations thereof.

In the depicted embodiment, substrate 505 includes a P-type doped region 503 (also referred to as a P-well) configured for two N-type Nanosheet transistors 510SN and a N-type Nanowire transistor 510WN, and a N-type doped region 504 (also referred to as an N-well) configured for two P-type Nanosheet transistors 510SP and a P-type Nanowire transistors 510WP. As depicted in FIG. 5A, substrate 505 includes two GAA cells, i.e. a Nanosheet cell 501 and a Nanowire cell 502. P-type Nanosheet transistors 510SP and N-type Nanosheet transistors 510SN are located in the Nanosheet cell 501, and P-type Nanowire transistor 510WP and N-type Nanowire transistor 510WN are located in the Nanowire cell 502. Each of the GAA cells 501 and 502 provides at least one circuit element. For example, in the depicted embodiment, Nanosheet cell 501 works as a NAND circuit and Nanowire cell 502 works as an inverter. The P-type doped region 503 may be substantially similar to the P-type doped regions discussed above (for example, 210, 230, 250, 410, 430, 450) in FIGS. 2 and 4, respectively. The N-type doped region 504 may be substantially similar to the N-type doped regions discussed above (for example, 220, 240, 420, 440) in FIGS. 2 and 4, respectively. Nanosheet cell 501 and Nanowire cell 502 may be referred to as the adjacent Nanosheet and Nanowire cells (for example, cells 1-1 and 1-2, or cells 3-1 and 3-2, etc.) in FIGS. 2 and 4, respectively.

Device 500 also comprises an isolation feature 575 (e.g., a shallow trench isolation (STI) feature) formed over and/or in substrate 505 to isolate various regions of GAA device 500. For example, isolation feature 575 (see FIG. 5D) separates and isolates active device regions and/or passive device regions from each other, such as P-type Nanosheet transistors 510SP, N-type Nanosheet transistors 510SN, P-type Nanowire transistor 510WP, and N-type Nanowire transistor 510WN. Isolation feature 575 further separates and isolates active regions 535 (including 535SN, 535SP, 535WN, and 535WP) from one another. Isolation feature 575 includes silicon oxide (SiO), silicon nitride (SiN), silicon oxynitride (SiON), other suitable isolation material (for example, including silicon, oxygen, nitrogen, carbon, or other suitable isolation constituent), or combinations thereof.

In FIGS. 5A-5D, Nanosheet cell 501 comprises N-type Nanosheet transistors 510SN including active region 535SN and P-type Nanosheet transistors 510SP including active region 535SP. Nanowire cell 502 comprises N-type Nanowire transistor 510WN including active region 535WN and P-type Nanowire transistor 510WP including active region 535WP. Active regions 535SN, 535SP, 535WN and 535WP (all together refers to active regions 535) are oriented substantially parallel to one another, each having a length defined in an x-direction, a width defined in a y-direction, and a thickness defined in a z-direction.

Each of the active regions 535SN, 535SP, 535WN and 535WP includes at least one channel region (covered by gate structures 530S or 530W), at least one source region, and at least one drain region defined along their length in the x-direction, where a channel region is disposed between a source region and a drain region (generally referred to as source/drain regions). In the depicted embodiment, each channel region of the active regions 535 comprises a stack of channel semiconductor layers 515S or 515W. As depicted in FIGS. 5B and 5C, channel semiconductor layers 515 (for example, 515S and 515W) are stacked vertically (in the z-direction) forming the channel regions of the GAA transistors (for example, 510SN, 510SP, 510WN and 510WP), respectively. In some embodiments, the number of the channel semiconductor layers 515S of the Nanosheet transistors 510SN/510SP in FIG. 5B equals to the number of the channel semiconductor layers of the Nanowire transistors 510WN/510WP in FIG. 5C. In some embodiments, 2 to 10 layers of the channel semiconductor layers 515 may be vertically stacked forming the channel regions of the GAA transistors 510. In some embodiments, a thickness in the z-direction of all the channel semiconductor layer 515 are the same. In some other embodiments, a thickness of each semiconductor layer may not be the same. For example, in the depicted embodiment, the thickness T1 of the channel semiconductor layers 515S of the Nanosheet gate structures 530S is about 3 nm to about 8 nm; and the thickness T2 of the channel semiconductor layers 515W of the Nanowire gate structures 530W is also about 3 nm to about 8 nm, which is substantially equal to T1. Furthermore, due to the different channel lengths (the width of active regions) of Nanosheet transistors and Nanowire transistors, a width in the y-direction of the Nanosheet channel semiconductor layer is larger than a width of the Nanowire channel semiconductor layer. For example, in the depicted embodiment, the width W1 of the Nanosheet channel semiconductor layers 515S (i.e. channel width W1 of Nanosheet transistors 510SN/510SP) is about 12 nm to about 40 nm; and the width W2 of the Nanowire channel semiconductor layers 515W (i.e. channel width W2 of Nanowire transistors 510WN/510WP) is about 4 nm to about 11 nm. In some embodiments, a ratio of the channel width W1 of Nanosheet transistors to the channel width W2 of the Nanowire transistors is about 1.3 to about 10. In some further embodiments, the Nanosheet channel width W1 is at least 1.5 to 4 times of the Nanowire channel width W2. The channel semiconductor layers 515 may include any suitable semiconductor materials, such as silicon (Si). In various embodiments, the semiconductor materials may include other materials such as silicon germanium (SiGe), germanium, a compound semiconductor such as silicon carbide, gallium arsenide, gallium phosphide, indium phosphide, indium arsenide and/or indium antimonite, an alloy semiconductor such as GaAsP, AlInAs, AlGaAs, InGaAs, GaInP, and/or GaInAsP, or combinations thereof. The channel semiconductor layers 515 may be doped or undoped depending on the design requirement of GAA device 500.

Gate structures are disposed over the channel regions of GAA transistors 510, such as Nanosheet gate structures 530S of Nanosheet transistors 510SN, 510SP, and Nanowire gate structures 530W of Nanowire transistors 510WN, 510WP. FIG. 5B depicts the cross-section views of the Nanosheet gate structure 530S along line 5B-5B in FIG. 5A. FIG. 5C depicts the cross-section views of the Nanowire gate structure 530W along line 5C-5C in FIG. 5A. In some embodiments, dummy gate structures 530D (referred to as the isolation structure 270 or 470 in the layout 200 or 400 in FIG. 2 or 4, respectively) are disposed between Nanosheet cell 501 and Nanowire cell 502 to separate the different types of GAA cells adjacent to each other. Gate structures 530S, 530W and 530D are all referred to as gate structures 530. As shown in FIG. 5A, gate structures 530 are arranged substantially parallel to one another, and each has a length defined in an x-direction, a width defined in a y-direction, and a thickness defined in a z-direction.

Nanosheet gate structures 530S and Nanowire gate structure 530W engage respective channel regions of Nanosheet transistors 510SN, 510SP and Nanowire transistors 510WN, 510WP, such that current can flow between respective source/drain regions of Nanosheet and Nanowire transistors during operation. As depicted in FIGS. 5A-5C, since Nanosheet cell 501 and Nanowire cell 502 are arranged in one row (along x-axis), a length of Nanosheet gate structures 530S substantially equals to a length of Nanowire gate structure 530W and further equals to a length of dummy gate structure 530D. As depicted in FIG. 5A, the gate length GL in the x-direction of each of gate structures 530 (including 530S and 530W) may be equal to or less than about 20 nm.

In the depicted embodiment, each of the Nanosheet cell 501 and Nanowire cell 502 comprises two gate structures extending in the y-direction, and the width of the gate structures (including Nanosheet gate structures 530S and Nanowire gate structures 530W) in the y-direction between gate end dielectric structure 540 are substantially the same, thus the height (in the y-direction) of the Nanosheet cell 501 and Nanowire cell 502 are substantially the same. For example, referring to FIG. 5A, Nanosheet cell 501 comprises P-type Nanosheet transistors 510SP and N-type Nanosheet transistors 510SN in the y-direction. And, Nanowire cell 502 comprises P-type Nanowire transistors 510WP and N-type Nanowire transistors 510WN in the y-direction. Accordingly, as depicted in FIG. 5B, the height of Nanosheet cell 501 is substantially equals to the height of Nanowire cell 502, and both equal to H1. Thus, Nanosheet cell 501 and Nanowire cell 502 can be integrated adjacently in one row and isolated by the dummy gate structures 530D according to the layouts 200 or 400 as depicted in FIG. 2 or 4.

As illustrated in FIGS. 5B and 5C, each of the gate structures 530S and 530W comprises a gate stack including a gate dielectric 590 and a gate electrode 585. A hard mask 580 is disposed over the gate electrode 585.

Gate dielectric 590 is conformally disposed around the vertically stacked channel semiconductor layers 515S and 515W, respectively, and interpose the channel semiconductor layers 515S, 515W and the gate electrodes 585. In the depicted embodiment, gate dielectric 590 is also disposed over a channel region in the substrate 505 and below the gate electrode 585. In some embodiments, gate dielectric 590 has a substantially uniform thickness along all the directions. For example, gate dielectric 590 may have a thickness of about 3 nm or less in all directions. In some embodiments, gate dielectric 590 includes a dielectric material, such as silicon oxide, high-k (k>=5) dielectric material, other suitable dielectric material, or combinations thereof.

Gate electrode 585 is disposed on gate dielectric 590, and further around the channel semiconductor layers 515S or 515W. Gate electrode 585 includes electrically conductive materials. In some embodiments, gate electrode 585 includes multiple layers, such as a capping layer, a work function layer, a glue/barrier layer, and a metal fill (or bulk) layer. The capping layer can include a material that prevents or eliminates diffusion and/or reaction of constituents between gate dielectric 590 and other layers of gate structures 530S or 530W (in particular, gate layers including metal). In some embodiments, the capping layer includes a metal and nitrogen, such as titanium nitride (TiN), tantalum nitride (TaN), tungsten nitride (W2N), titanium silicon nitride (TiSiN), tantalum silicon nitride (TaSiN), or combinations thereof. The work function layer can include a conductive material tuned to have a desired work function (such as an N-type work function or a P-type work function). Work function materials include TiN, TaN, TiAl, TiAlN, TaAl, TaAlN, TaAlC, TaCN, Al, W, Cu, Co, Ni, Pt, or any combination thereof. The glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. The metal fill layer can include a suitable conductive material, such as Al, W, and/or Cu.

Hard mask 580 is disposed over the gate electrode 585 and may include any suitable material, such as silicon and nitrogen (for example, silicon nitride).

As illustrated by FIGS. 5A and 5D, the dummy isolation gate structures 530D are arranged as isolation structures between Nanosheet cell 501 and the adjacent Nanowire cell 502. For example, as depicted in FIG. 5A, a dummy isolation gate structure 530D configured as a single gate OD break isolation is formed between the Nanosheet cell 501 and the Nanowire cell 502. The dummy isolation gate structures 530D may be a single dielectric layer or multiple dielectric layers selected from silicon dioxide (SiO2), silicon oxycarbide (SiOC), silicon nitride (SiN), silicon carbon nitride (SiCN), silicon oxynitride (SiON), silicon oxycarbonnitride (SiOCN), carbon content oxide, nitrogen content oxide, carbon and nitrogen content oxide, metal oxide dielectric, hafnium oxide (HfO2), tantalum oxide (Ta2O5), titanium oxide (TiO2), zirconium oxide (ZrO2), aluminum oxide (Al2O3), yttrium oxide (Y2O3), multiple metal content oxide, or any combination thereof.

Still referring to FIGS. 5A and 5D, gate structures 530S, 530W, and 530D further include respective gate spacers 520 disposed adjacent to (for example, along sidewalls of) the respective gate stacks. Gate spacers 520 comprise a dielectric material. The dielectric material can be selected from silicon, oxygen, carbon, nitrogen, low-k dielectric (k<3.5), other suitable material, or combinations thereof (for example, silicon oxide, silicon nitride, silicon oxynitride, or silicon carbide). Gate spacers 520 may include a single layer or a multilayer structure. In some embodiments, gate spacers 520 may have a thickness of few nanometers.

Including as illustrated in FIGS. 5A-5C, along the y-direction, at each end of the gate structures 530, a gate end dielectric structure 540 is formed to isolate the gate structures 530 of Nanosheet and/or Nanowire cells in different rows of cells in device 500. In some embodiments, gate end dielectric structures 540 comprise dielectric material selected from silicon, oxygen, carbon, nitrogen, low-k dielectric (k<3.5), other suitable material, or combinations thereof (for example, silicon oxide, silicon nitride, silicon oxynitride, or silicon carbide).

As illustrated in FIG. 5D, epitaxial source/drain features 545S are provided as source/drain regions of Nanosheet transistors 510SP and 510SN, and epitaxial source/drain features 545W are provided as source/drain regions of Nanowire transistors 510WP and 510WN. Epitaxial source/drain features 545S and 545W both are referred to as epitaxial source/drain features 545.

Epitaxial source/drain features 545 may comprise semiconductor materials such as silicon (Si), phosphorus (P), silicon phosphide (SiP), silicon carbide (SiC), germanium (Ge), silicon germanium (SiGe), one or more III-V materials, a compound semiconductor, or an alloy semiconductor. In some embodiments, epitaxial source/drain features 545 are doped with N-type dopants and/or P-type dopants. For example, epitaxial source/drain feature 545 may include SiGe doped with boron for forming source/drain features for a P-type FET. In some embodiments, epitaxial source/drain feature 545 may include silicon doped with phosphorous for forming source/drain features for a N-type FET. In some embodiments, epitaxial source/drain features 545 include materials and/or dopants that achieve desired tensile stress and/or compressive stress in the channel regions. In various embodiments, epitaxial source/drain features 545 may comprises more than one epitaxial layers, and different epitaxial layers of epitaxial source/drain features 545 may comprise same or different semiconductor materials.

In some embodiments, device 500 comprises silicide layers 525 formed over the epitaxial source/drain features 545 over the source/drain regions. In some embodiments, the silicide layers 525 include nickel silicide, titanium silicide, or cobalt silicide. In some embodiments, the silicide layers 525 and epitaxial source/drain features 545 are collectively referred to as the epitaxial source/drain features of device 500.

An inter-level dielectric (ILD) layer 595 is disposed over substrate 505, especially over gate structures 530S, 530W, 530D, source/drain features 545S, 545W, and isolation features 575. ILD layer 595 includes a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, or combinations thereof. In some embodiments, ILD layer 595 can include a multilayer structure having multiple dielectric materials.

Device-level source/drain contacts 550, gate vias 560, and source/drain vias 570 are disposed over the gate and source/drain regions extend through the ILD layer 595 to couple the transistor elements to overlying interconnect structures. Device-level contacts 550, gate vias 560, and source/drain vias 570 include any suitable electrically conductive material, such as Ta, Ti, Al, Cu, Co, W, TiN, TaN, other suitable conductive materials, or combinations thereof. Various conductive materials can be combined to provide device-level contacts 550, gate vias 560, and source/drain vias 570 with various layers, such as a barrier layer, an adhesion layer, a liner layer, a bulk layer, other suitable layer, or combinations thereof. In some embodiments, device-level contacts 550 include Ti, TiN, and/or Co; gate vias 560 and source/drain vias 570 (referred to as vias 560, 570) include Ti, TiN, and/or W.

In some embodiments, ILD layer 595, contacts 550, vias 560, 570 are a portion of and/or interconnects to a multilayer interconnect (MLI) feature disposed over substrate 505. The MLI feature electrically couples various components of device 500, such that the various components are operable to function as specified by design requirements of device 500. The gate vias 560 and source/drain vias 570 may provide an interconnect to a first metallization layer (e.g., M0) of the MLI.

Figure 6B:
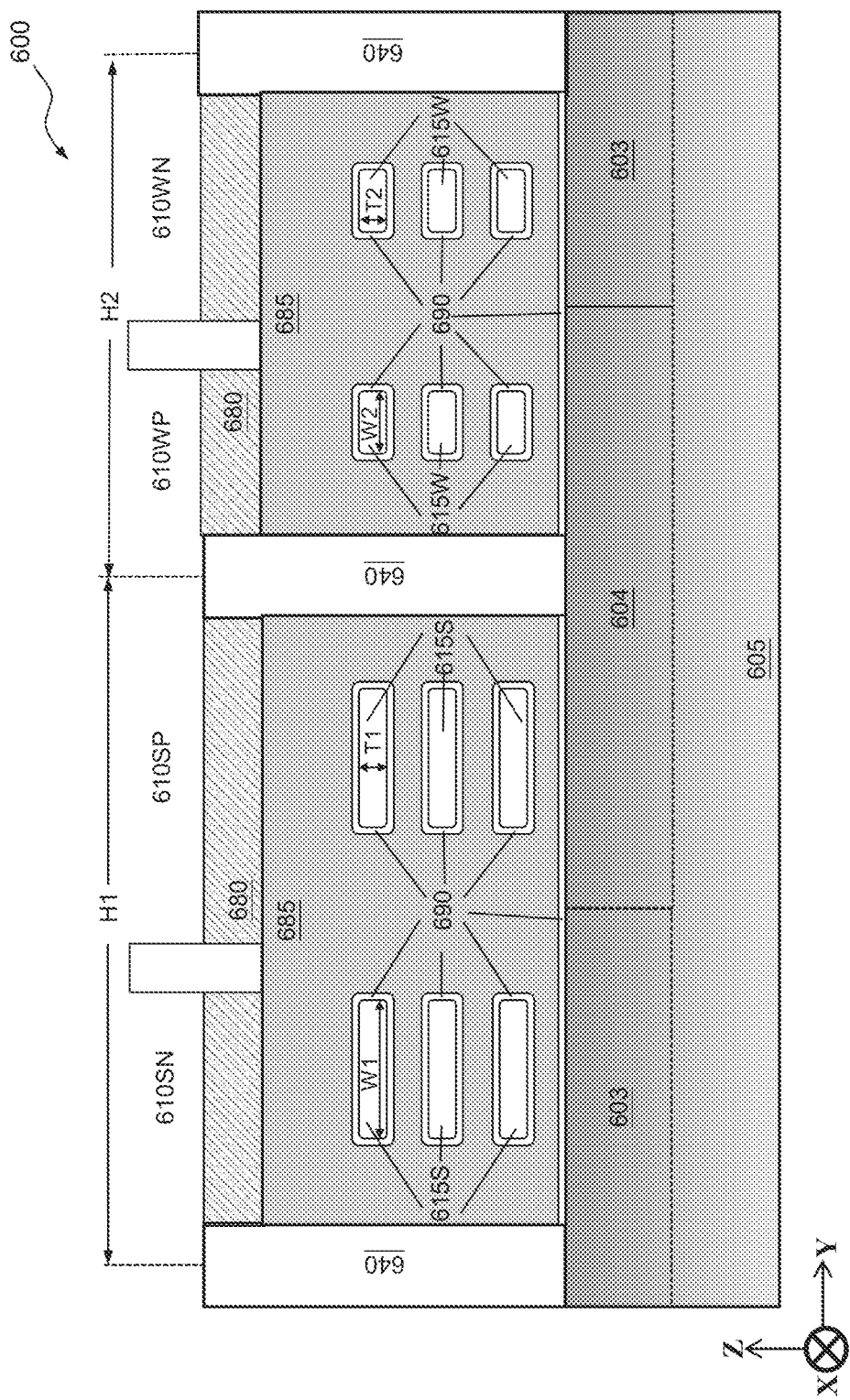
Figure 6C:
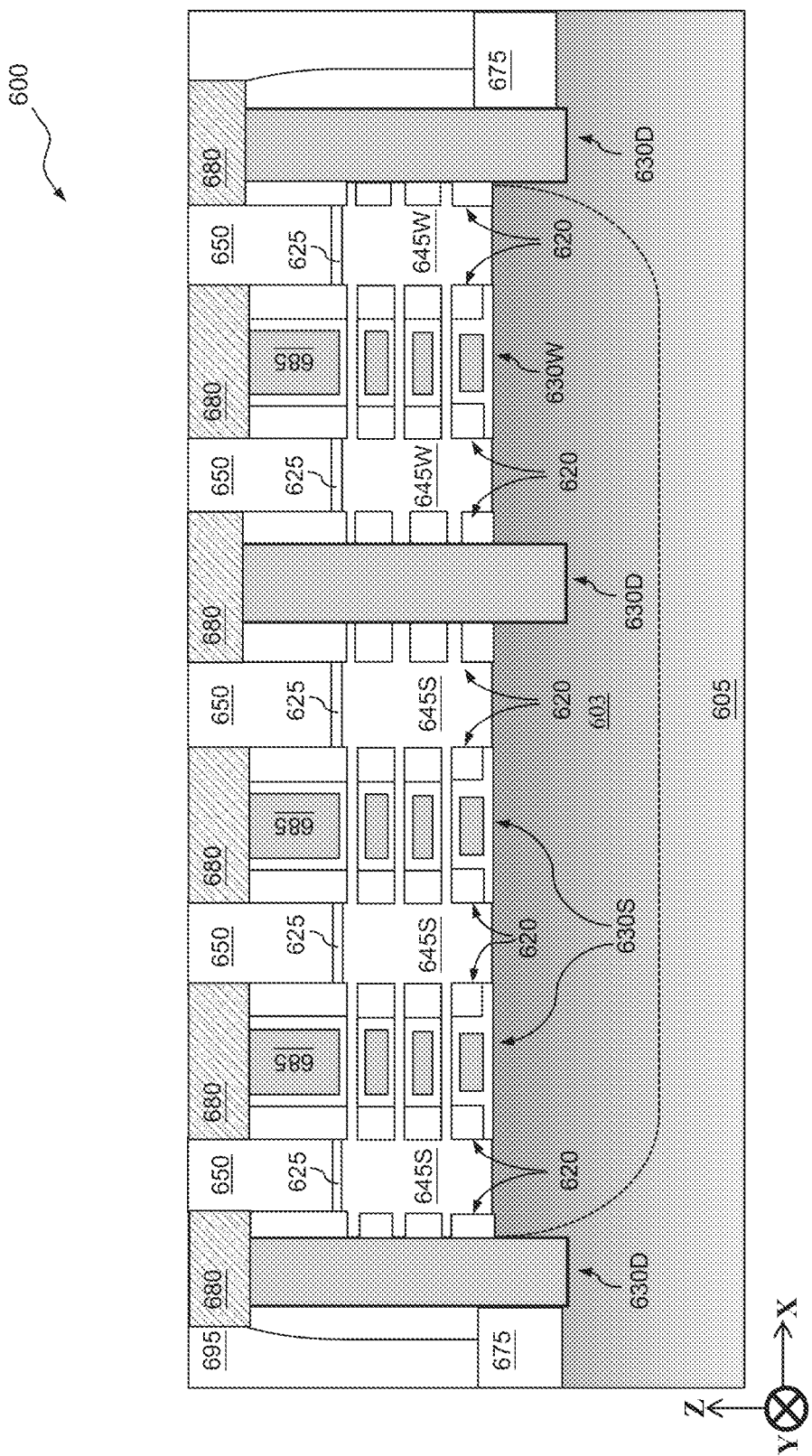

Turning now to the embodiment of FIGS. 6A-6C, illustrated are simplified schematic figures of a device 600 comprising different types of GAA cells, for example, Nanosheet cells 601, 601' and Nanowire cells 602, 602', respectively arranged in different rows and are vertically abutted together. The circuit 600 may be an embodiment of a portion of the layout 300 illustrated in FIG. 3. For example, Nanosheet cells 601 and 601' may be an embodiment of NS cells 1-1 and 1-2, and Nanowire cells 602 and 602' may be an embodiment of NW cells 2-1 and 2-2 of layout 300 in FIG. 3. As depicted in FIG. 6A, Nanosheet cells 601 and 601' are arrange in an upper row 608S and Nanowire cells 602 and 602' are arrange in a lower row 608W. Device 600 may be located in a core area 101 of the IC 100 in FIG. 1. In an embodiment, Nanosheet cells 601 and 601' are illustrative of embodiments of the first group Nanosheet circuit 110 and Nanowire cells 602 and 602' are illustrative of embodiment of the second group Nanowire circuit 120.

FIG. 6A is a simplified schematic top view of device 600 (for example, in an x-y plane); FIG. 6B is a diagrammatic cross-sectional view of device 600 along line 6B-6B of FIG. 6A (for example, in a y-z plane); and FIG. 6C is a diagrammatic cross-sectional view of device 600 along line 6C-6C of FIG. 6A (for example, in an x-z plane). FIGS. 6A-6C have been simplified for the sake of clarity to better understand the inventive concepts of the present disclosure. Additional features can be added in device 600, and some of the features described below can be replaced, modified, or eliminated in other embodiments of device 600.

Materials of different features of device 600 are the same as the corresponding features of device 500, thus will not be repeated in the following description.

In the depicted embodiment of FIG. 6A, device 600 comprises a substrate 605 having formed thereon two rows of GAA cells, i.e. an upper row 608S and a lower row 608W. In some embodiments, substrate 605 may be the same substrate as the substrate 505 of device 500. For example, each of device 600 and device 500 may be included in the core area 101 of the IC 100. Each row of GAA cells, 608S and 608W, comprises only one type of GAA transistors, for example, Nanosheet transistor or Nanowire transistor, respectively. For example, the upper row 608S of device 600 comprises two Nanosheet cells 601 and 601' each including nanosheet transistors. Nanosheet cell 601 comprises an N-type Nanosheet transistor 610SN and a P-type Nanosheet transistor 610SP. Nanosheet cell 601' comprises an N-type Nanosheet transistor 610SN' and P-type Nanosheet transistor 610SP'. In FIG. 6A, the lower row 608W of device 600 comprises two Nanowire cells 602 and 602' each including nanowire transistors. Nanowire cell 602 comprises N-type Nanowire transistor 610WN and P-type Nanosheet transistor 610WP. Nanowire cell 602' comprises N-type Nanowire transistor 610WN' and P-type Nanowire transistor 610WP'. Substrate 605 also comprises P-type doped region 603 (referred to as a P-well) doped with P-type dopants and N-type doped region 604 (referred to as a N-well) doped with N-type dopants similar to as discussed above. P-well 603 is configured for N-type GAA transistors, including N-type Nanosheet transistors 610SN, 610SN' and N-type Nanowire transistors 610WN, 610WN'. N-well 604 is configured for P-type GAA transistors, including P-type Nanosheet transistors 610SP, 610SP' and P-type Nanowire transistors 610WP, 610WP'. P-well 603 may be an embodiment of the P-well 310, 330, or 350 of layout 300 in FIG. 3. N-well 604 may be referred to as the N-well 320 or 340 of layout 300 in FIG. 3.

An isolation feature 675 (e.g., STI) isolates the active regions 635SN, 635SN', 635SP, 635SP', 635WN, 635WN', 635WP, 635WP' (together referred to as active regions 635) of device 600. As depicted in the embodiment, 635SN, 635SN' are active regions for N-type Nanosheet transistors 610SN and 610SN' respectively; 635SP, 635SP' are active regions for P-type Nanosheet transistors 610SP, 610SP' respectively; 635WN, 635WN' are active regions for N-type Nanowire transistors 610WN, 610WN' respectively; and 635WP, 635WP' are active regions for P-type Nanowire transistors 610WP, 610WP' respectively. Active regions 635 are oriented substantially parallel to one another, each having a length defined in an x-direction, a width defined in a y-direction, and a thickness defined in a z-direction.

Each of the active regions 635 defines at least one channel region (covered by gate structures 630S or 630W), at least one source region, and at least one drain region defined along their length in the x-direction, where a channel region is disposed between a source region and a drain region (generally referred to as source/drain regions). As depicted in FIG. 6B, each channel region of the active regions 635 comprises a stack of channel semiconductor layers 615S or 615W of the Nanosheet transistors 610SN/610SP and Nanowire transistors 610WN/610WP, respectively. In FIG. 6B, the number of the channel semiconductor layers 615S of the Nanosheet transistors 610SN/610SP equals to the number of the channel semiconductor layers of the Nanowire transistors 610WN/610WP. In some embodiments, 2 to 10 layers of the channel semiconductor layers 615 may be vertically stacked over each of the channel regions of the GAA transistors 610. In some embodiments, a thickness in the z-direction of all the channel semiconductor layer 615 are the same. In some other embodiments, a thickness of each semiconductor layer may not be the same. For example, in the depicted embodiments, the thickness T1 of the Nanosheet channel semiconductor layers 615S is about 3 nm to about 8 nm; and the thickness T2 of the Nanowire channel semiconductor layers 615W is also about 3 nm to about 8 nm, which is substantially equal to T1. Furthermore, a width in the y-direction of the Nanosheet channel semiconductor layer is larger than a width of the Nanowire channel semiconductor layer. For example, in the depicted embodiments, the width W1 of the Nanosheet channel semiconductor layers 615S (i.e. channel width W1 of Nanosheet transistors 610SN/610SP) is about 12 nm to about 40 nm; and the width W2 of the Nanowire channel semiconductor layers 615W (i.e. channel width W2 of Nanowire transistors 610WN/610WP) is about 4 nm to about 11 nm. In some embodiments, a ratio of the Nanosheet channel width W1 to the Nanowire channel width W2 is about 1.3 to about 10. In some further embodiments, the Nanosheet channel width W1 is at least 1.5 to 4 times of the Nanowire channel width W2.

Gate structures are disposed over the channel regions of GAA transistors 610, such as Nanosheet gate structures 630S of Nanosheet transistors 610SN and 610SP; Nanosheet gate structures 630S' of Nanosheet transistors 610SN' and 610SP'; Nanowire gate structures 630W of Nanowire transistors 610WN and 610WP; and Nanowire gate structures 630W' of Nanowire transistors 610WN' and 610WP'. FIG. 6B depicts the cross-sectional views of the Nanosheet gate structure 630S and the Nanowire gate structure 630W along line 6B-6B in FIG. 6A. In some embodiments, dummy gate structures 630D are disposed between Nanosheet cells 601 and 601' and/or between Nanowire cells 602 and 602' to separate the GAA cells adjacent to each other in a row. Gate structures 630S, 630W, 630S', 630W' and 630D are all referred to as gate structures 630. As shown in FIG. 6A, gate structures 630 are arranged substantially parallel to one another, and each has a length defined in an x-direction between the source/drain regions, and a width defined in a y-direction between gate end dielectric structures 640.

Similar as gate structures 530, each of gate structures 630 comprises a gate stack including a gate dielectric 690, a gate electrode 685, and a hard mask 680. Gate dielectric 690 is conformally disposed around the vertically stacked channel semiconductor layers 615S and 615W, respectively, and interpose the channel semiconductor layers 615S, 615W and the gate electrodes 685. In the depicted embodiment, gate dielectric 690 is also disposed over the substrate 605 and below the gate electrode 685. In some embodiments, gate dielectric 690 has a substantially uniform thickness along all the directions. For example, gate dielectric 690 may have a thickness of about 3 nm or less in all directions. In the depicted embodiment, gate electrode 685 is disposed over the gate dielectric 690, and further around the channel semiconductor layers 615S or 615W. In the depicted embodiment, hard mask 680 is disposed over the gate electrode 685.

Nanosheet gate structures 630S, 630S' and Nanowire gate structure 630W, 630W' engage respective channel regions of Nanosheet transistors 610SN, 610SP, 610SN', 610SP' and Nanowire transistors 610WN, 610WP, 610WN', 610WP', respectively, such that current can flow between respective source/drain regions of the respective Nanosheet and Nanowire transistors during operation. As depicted in FIGS. 6A and 6B, Nanosheet cells 601, 601' and Nanowire cells 602, 602' are arranged in different rows. A length of Nanosheet gate structures 630S, 630S' substantially equals to a length of Nanowire gate structure 630W, 630W'. In some embodiments, the gate length GL of each of gate structures 630 may be equal to or less than about 20 nm.

In the depicted embodiment, each of the Nanosheet cells 601, 601' comprises two rows of Nanosheet transistors in the y-direction; and each of the Nanowire cells 602, 602' comprises two rows of Nanowire transistors in the y-direction. And, the height H1 of Nanosheet cells 601, 601' (the upper row 608S) is larger than the height H2 of Nanowire cells 602, 602' (the lower row 608W). One of the reasons that the height H1 is large than the height H2 is that the channel width (i.e. W1) of the Nanosheet transistors is larger than the channel width (i.e. W2) of the Nanowire transistors, as shown in FIG. 6B. In the depicted embodiment, the width W1 of Nanosheet channel semiconductor layers 615S (for example, about 12 nm to about 40 nm) is larger than the width W2 of Nanowire channel semiconductor layers 615W (for example, about 4 nm to about 11 nm). In some other embodiments, the height H1 may be equal or less than the height H2 by adjusting the width of gate electrode 685 along the y-direction according to the design requirements of device 600.

As illustrated in FIGS. 6A and 6C, dummy gate structures 630D are arranged as isolation structures between adjacent Nanosheet cells in one row or Nanowire cells in one row. For example, as depicted in FIG. 6A, one dummy gate structure 630D configured as a single gate isolation is formed between the Nanosheet cell 601 and the Nanosheet cell 601', and another dummy gate structure 630D configured as a single gate isolation is formed between the Nanowire cell 602 and the Nanowire cell 602'.

Still referring to FIGS. 6A and 6C, gate structures 630 further include respective gate spacers 620 disposed adjacent to (for example, along sidewalls of) the respective gate stacks. Gate spacers 620 may include a single layer of dielectric material or a multilayer structure having multiple dielectric materials. In some embodiments, gate spacers 620 may have a thickness of a few nanometers.

Referring to FIGS. 6A and 6B, along the y-direction, at each end of the gate structures 630, a gate end dielectric structure 640 is formed to isolate the gate structures 630 of different rows of Nanosheet cells or Nanowire cells in device 600.

Referring to FIG. 6D, epitaxial source/drain features 645S are formed as source/drain regions of Nanosheet transistors, and epitaxial source/drain features 645W are formed as the source/drain regions of Nanowire transistors. Epitaxial source/drain features 645S and 645W are both referred to as epitaxial source/drain features 645. In various embodiments, epitaxial source/drain features 645 may comprises more than one epitaxial layers, and different epitaxial layers of epitaxial source/drain features 645 may comprise same or different semiconductor materials.

In some embodiments, device 600 comprises silicide layers 625 formed over the epitaxial source/drain features 645 over the source/drain regions. In some embodiments, the silicide layers 625 and epitaxial source/drain features 645 are collectively referred to as the epitaxial source/drain features of device 600.

As illustrated in FIG. 6D, an inter-level dielectric (ILD) layer 695 is disposed over substrate 605, especially over the gate structures, source/drain features, and isolation features. In some embodiments, ILD layer 695 can include a multilayer structure having multiple dielectric materials.

Device-level source/drain contacts, gate vias, and source/drain vias are disposed over the gate (channel) regions and source/drain regions and extend through the ILD layer 695 to form interconnect structures. Various conductive materials can be combined to provide device-level contacts, gate vias, and source/drain vias with various layers, such as a barrier layer, an adhesion layer, a liner layer, a bulk layer, other suitable layer, or combinations thereof.

In some embodiments, ILD layer 695, contacts, and vias are a portion of and/or interconnects to a multilayer interconnect (MLI) feature disposed over substrate 605. The MLI feature electrically couples various components of device 600, such that the various components are operable to function as specified by design requirements of device 600. The vias may provide a connection to a metallization layer (e.g., M0) of the MLI.

Referring again to FIG. 1, as discussed above, the IC 100 may also comprise a third group circuit 130 including a plurality of FinFETs and located in the core area of the IC 100. The third group FinFET circuit 130 is separated from the adjacent first group Nanosheet circuit 110 and second group Nanowire circuit 120. In some examples, a distance between the third group FinFET circuit 130 and the first and second Nanosheet/Nanowire circuit 110 and 120 is larger than at least four times of the gate pitch of the FinFET, or four times of the channel pitch of the GAA transistor, or at least four times of both the channel pitch and the gate pitch of the GAA transistors. IC 100 may also comprise a fourth group circuit 140 comprising a plurality of FinFETs and located in the I/O area 105 of the IC 100.

Figure 7B:
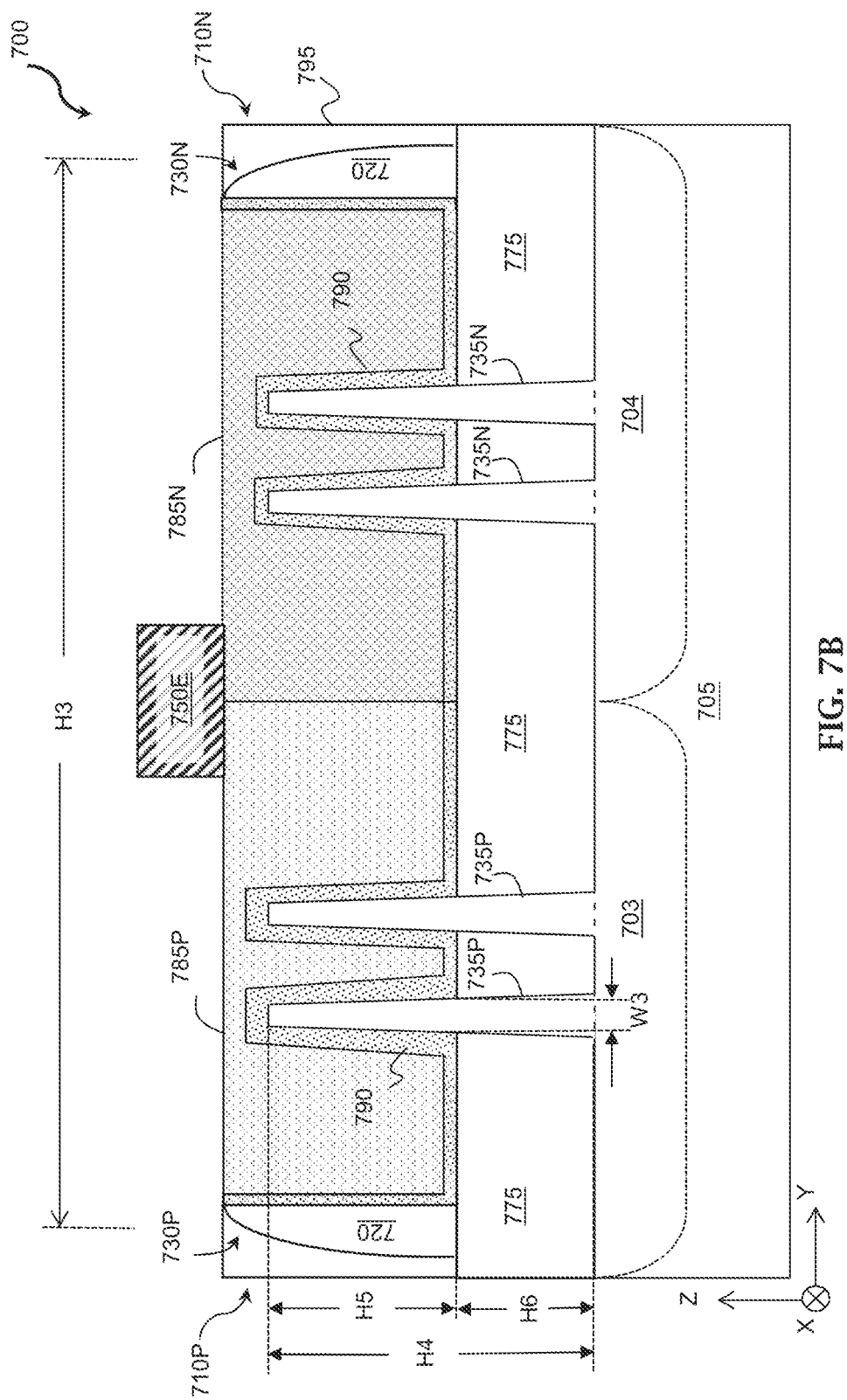
Figure 7C:
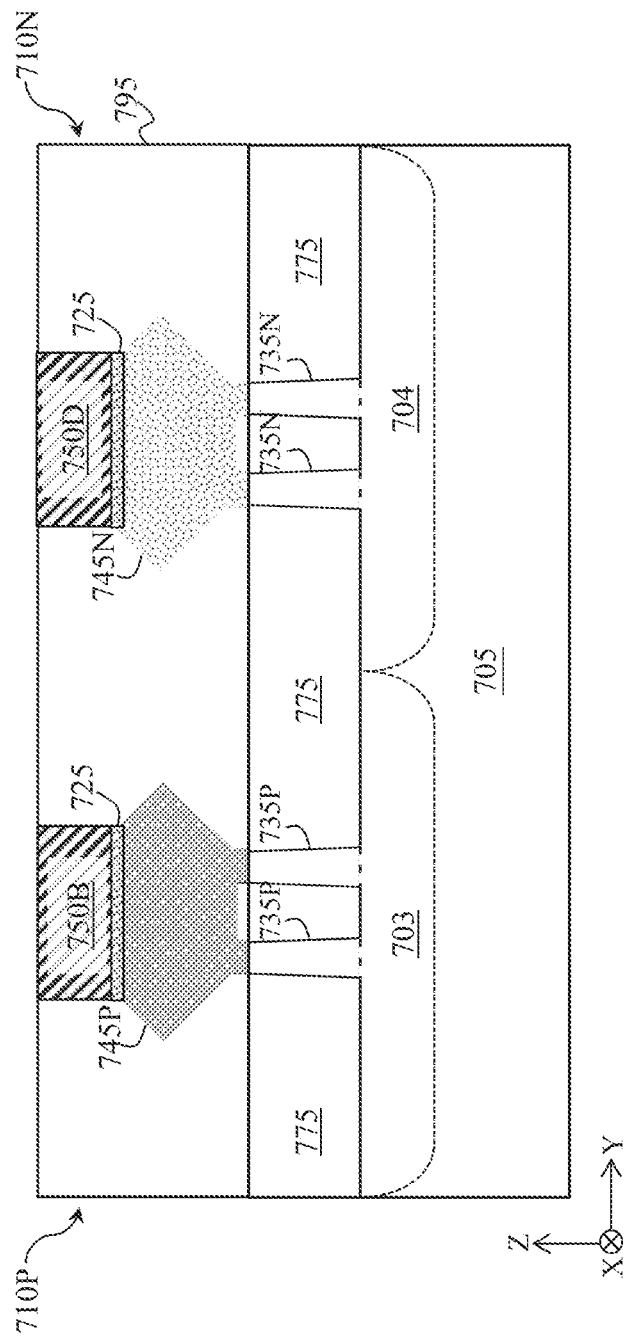
Figure 7D:
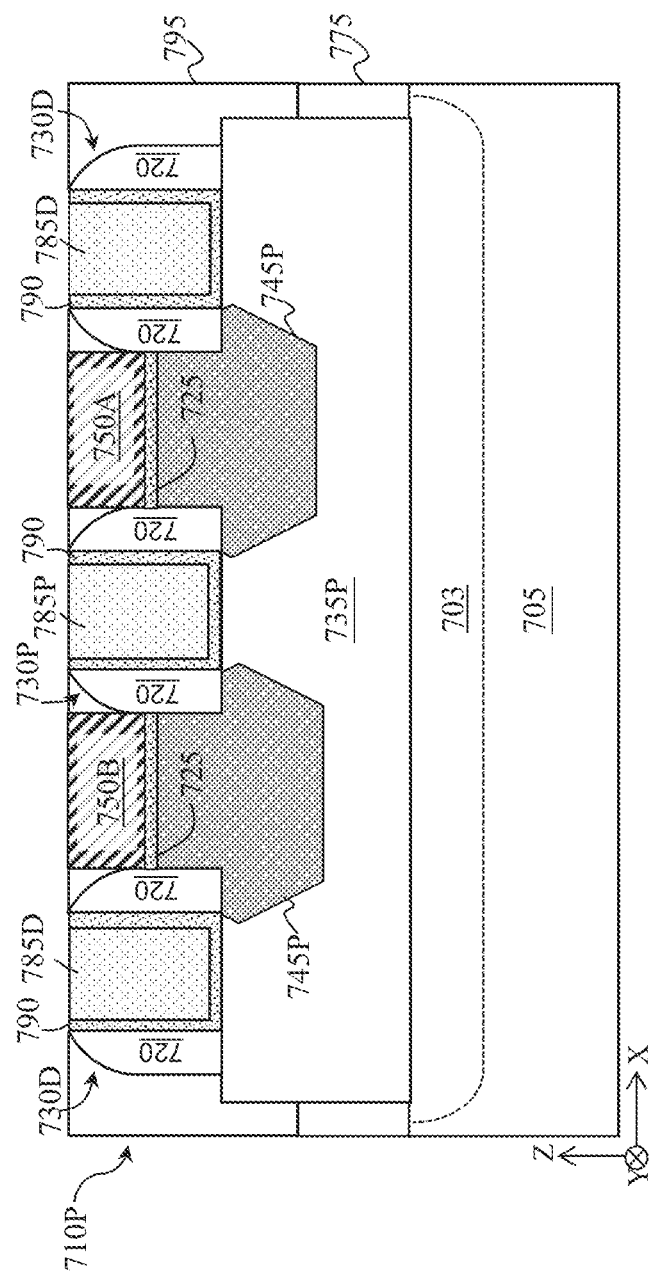

FIGS. 7A-7D are simplified schematic figures of a device 700. The device 700 may be located in a core area 101 or an I/O area 105 of the IC 100 according to the schematic layout of FIG. 1. In an embodiment, the device 700 provides, or is a component of, the FinFET based circuit 130 of the core area 101. In another embodiment, the device 700 provides, or is a component of, the FinFET based circuit 140 of the I/O area 105. FIG. 7A is a simplified schematic top view of the device 700 (for example, in an x-y plane); FIG. 7B is a diagrammatic cross-sectional view of device 700 along line 7B-7B of FIG. 7A (for example, in a y-z plane); FIG. 7C is a diagrammatic cross-sectional view of device 700 along line 7C-7C of FIG. 7A (for example, in an y-z plane), and FIG. 7D is a diagrammatic cross-sectional view of device 700 along line 7D-7D of FIG. 7A (for example, in an x-z plane). FIGS. 7A-7D have been simplified for the sake of clarity to better understand the inventive concepts of the present disclosure. Additional features can be added in device 700, and some of the features described below can be replaced, modified, or eliminated in other embodiments of device 700.

As depicted in FIGS. 7A-7D, device 700 comprises a P-type FinFET 710P and a N-type FinFET 710N formed over a substrate 705. In some embodiments, substrate 705 may be the same substrate 505 for device 500 as well as the substrate 605 for device 600. In other words, in an embodiment, devices 500, 600 and/or 700 are formed on a single substrate such as to form IC 100 as illustrated in FIG. 1. In some embodiments, substrate 705 includes P-type doped regions (for example, P-type wells) doped with P-type dopants, such as boron (for example, BF2), indium, other P-type dopant, or combinations thereof. In some embodiments, substrate 705 includes N-type doped regions (for example, N-type wells) doped with N-type dopants, such as phosphorus, arsenic, other N-type dopant, or combinations thereof. In some embodiments, substrate 705 includes doped regions formed with a combination of P-type dopants and N-type dopants. In the depicted embodiment, doped region 703 is an N-type well configured for a P-type FinFET 710P and doped region 704 is a P-type well configured for a N-type FinFET 710N. The various doped regions can be formed directly on and/or in substrate 705, for example, providing a P-well structure, an N-well structure, a dual-well structure, a raised structure, or combinations thereof.

An isolation feature 775 (e.g., STI) is formed over and/or in substrate 705 to isolate various regions, such as various device regions, of device 700. For example, isolation feature 775 separates and isolates active device regions and/or passive device regions from each other, such as P-type FinFET 710P and N-type FinFET 710N. Isolation feature 775 further separates and isolates fins 735P and 735N (active fin regions) from one another. In the depicted embodiment, isolation feature 775 surrounds a lower portion of fins 735. Isolation feature 775 includes silicon oxide, silicon nitride, silicon oxynitride, other suitable isolation material (for example, including silicon, oxygen, nitrogen, carbon, or other suitable isolation constituent), or combinations thereof. Isolation feature 775 can include different structures, such as shallow trench isolation (STI) structures, deep trench isolation (DTI) structures, and/or local oxidation of silicon (LOCOS) structures.

In the depicted embodiment of FIGS. 7A-7D, device 700 includes fins 735 (also referred to as fin active regions) disposed over substrate 705. In FIGS. 7A-7D, P-type FinFET 710P includes P-type fins 735P disposed over N-type doped region 703; N-type FinFET 710N includes N-type fins 735N disposed over P-type doped region 704. P-type FinFET 710P and N-type FinFET 710N are multi-fin FinFETs, though the present disclosure contemplates embodiments where P-type FinFET 710P and N-type FinFET 710N include more or less fins, such as a single fin. Fins 735P and 735N (all referred to as fins 735) are oriented substantially parallel to one another, each having a length defined in a x-direction, a width defined in an y-direction, and a height defined in a z-direction. In some examples, as depicted in FIG. 7B, a height H4 of the fins 735 is about 60 nm to 300 nm. As depicted in FIG. 7B, upper portions of the fins 735 are exposed above the isolation feature 775. In some embodiments, a height H5 of the upper portion of the fins 735 above the isolation feature is about 40 nm to 80 nm; and a height H6 of the lower portion of the fins 735 under the top surface of the isolation feature 775 is about 30 nm to about 250 nm. In the depicted embodiment, a width of fins 735 varies from an upper portion of fins 735 to a lower portion of fins 735. In the depicted embodiment, the width tapers from the lower portion of fins 735 to the upper portion of fins 735, such that an average width of the upper portion is less than an average width of the lower portion. In some embodiments, a width of fins 735P of P-type FinFET 710P is different than a width of fins 735N of N-type FinFET 710N. In some embodiments, the widths are not tapered, such that at least one of fins 735 have substantially the same width along its height. In the depicted embodiment, a width W3 along the y-direction of the upper portion of the fins 735 is about 4 nm to 15 nm.

Fins 735 provide a channel region (covered by the gate structures 730 P or 730N). The fins 735 may include or have formed thereon at least one source region and at least one drain region defined along their length in the x-direction, where a channel region is disposed between a source region and a drain region (generally referred to as source/drain regions). In some embodiments, fins 735 are a portion of substrate 705 (such as a portion of a material layer of substrate 705). For example, in the depicted embodiment, substrate 705 includes silicon, fins 735 include silicon. Alternatively, in some embodiments, fins 735 are defined of a material layer, such as one or more semiconductor material layers, overlying substrate 705. The semiconductor material layers can include any suitable semiconductor materials, such as silicon, germanium, silicon germanium, other suitable semiconductor materials, or combinations thereof.

Gate structures are disposed over fins 735, such as gate structures 730P, 730N and 730D (all refers to gate structures 730). Gate structures 730 extend along the y-direction (for example, substantially perpendicular to fins 735). As depicted in FIGS. 7A and 7B, each of gate structures 730 has a length along the x-direction between the source/drain regions. The gate length of device 700 (for example, FinFETs in the third group circuit 130) is larger than the gate length of Nanosheet and/or Nanowire transistors (for example, GAA transistors in the first group circuit 110 and the second group circuit 120). In some embodiments, the gate length of the GAA transistors is less than 20 nm, and the gate length of the FinFETs is larger than 30 nm. In other words, the gate length of the FinFETs is at least 1.5 times of the gate length of the GAA transistors. Device 700 comprises FinFET 710P and 710N arranged in two rows, device 700 has a height H3 in y-direction. The height H3 is not related with the height H1 and/or H2. Thus, the height H3 may be larger than, equal to, or less than the height H1 and/or H2.

In the depicted embodiment, gate structures 730P and 730N are disposed over the channel regions of fins 735. In some embodiments, gate structures 730P and 730N wrap respective channel regions of fins 735, thereby interposing respective source/drain regions of fins 735. Gate structures 730P and 730N engage respective channel regions of fins 735, such that current can flow between respective source/drain regions of fins 735 during operation. In furtherance of the depicted embodiment, gate structures 730P and 730N are active gate structures, whereas gate structures 730D are dummy gate structures to isolate device 700 from other devices in the IC 100. In some embodiments, gate structures 730D enable a substantially uniform processing environment, for example, enabling uniform epitaxial material growth in source/drain regions of fins 735 (for example, when forming epitaxial source/drain features), uniform etch rates in source/drain regions of fins 735 (for example, when forming source/drain recesses), and/or uniform, substantially planar surfaces (for example, by reducing (or preventing) CMP-induced dishing effects).

Referring to FIGS. 7B and 7D, gate structures 730P and 730N include gate stacks configured to achieve desired functionality according to design requirements of device 700. Gate structures 730 may include same or different layers and/or materials. In the depicted embodiment, gate structures 730 have gate stacks that include gate dielectrics 790 and gate electrode 785P, 785N and 785D.

Gate dielectrics 790 are conformally disposed over fins 735P, 735N and isolation feature 775, such that gate dielectrics 790 have a substantially uniform thickness. Gate dielectrics 790 include a dielectric material, such as silicon oxide, high-k dielectric material, other suitable dielectric material, or combinations thereof. In the depicted embodiment, gate dielectrics 790 include a high-k dielectric material (and thus may be referred to as a high-k dielectric layer), such as hafnium dioxide (HfO2), HfSiO, HfSiON, HfTaO, HfTiO, HfZrO, zirconium oxide, aluminum oxide, hafnium dioxide-alumina (HfO2-Al2O3) alloy, other suitable high-k dielectric material, or combinations thereof.

Depending on the location (core area 101 or I/O area 105 of the IC 100) of the FinFET device 700, a thickness of the gate dielectrics may be different. In some embodiments, the thickness of gate dielectrics of FinFETs in the fourth group circuit 140 in the I/O area 105 of the IC 100 is larger than the thickness of gate dielectrics of FinFETs in the third group circuit 130 in the core area 101 of the IC 100. In some embodiments, the thickness of gate dielectrics of GAA transistors or FinFETs in the core area 101 (including Nanosheet transistors in the first group circuit 110, Nanowire transistors in the second group circuit 120, and FinFETs in the third group circuit 130) are substantially the same. For example, a thickness of gate dielectric of GAA transistors and/or FinFETs (the first, second, and third group circuits) in the core area 101 is less than about 3 nm, and a thickness of the gate dielectric of the FinFETs (the fourth group circuit) in the I/O area 105 is thicker than about 4 nm.

Still referring to FIGS. 7A-7D, gate electrodes 785P, 785N, and 785D (all referred to as gate electrodes 785) are disposed over gate dielectric 790. Gate electrodes 785P and 785N includes an electrically conductive material. In some embodiments, the electrically conductive material of FinFET gate electrodes 785P and 785N is substantially the same as the electrically conductive material of the Nanosheet/Nanowire gate electrodes 585 and 685 for device 500 and 600, respectively. In some other embodiments, the electrically conductive material of FinFET gate electrodes 785P and 785N is different from the electrically conductive material of the Nanosheet/Nanowire gate electrodes 585 and 685. Gate electrodes 785D include dielectric dummy gate material. In some embodiments, each of gate electrodes 785P and 785N may comprise multiple layers, such as a capping layer, a work function layer, a glue/barrier layer, and a metal fill (or bulk) layer. The capping layer includes a metal and nitrogen, such as titanium nitride (TiN), tantalum nitride (TaN), tungsten nitride (W2N), titanium silicon nitride (TiSiN), tantalum silicon nitride (TaSiN), or combinations thereof. The work function materials include TiN, TaN, TiAl, TiAlN, TaAl, TaAlN, TaAlC, TaCN, Al, W, Cu, Co, Ni, Pt, or any combination thereof. The glue/barrier layer includes metal (for example, W, Al, Ta, Ti, Ni, Cu, Co, other suitable metal, or combinations thereof), metal oxides, metal nitrides (for example, TiN), or combinations thereof. The metal fill layer includes a suitable conductive material, such as Al, W, and/or Cu.

Gate structures 730 further include respective gate spacers 720 disposed adjacent to (for example, along sidewalls of) the respective gate stacks. Gate spacers 720 comprise a dielectric material selected from silicon, oxygen, carbon, nitrogen, low-k dielectric (k<3.5), other suitable material, or combinations thereof (for example, silicon oxide, silicon nitride, silicon oxynitride, or silicon carbide). Gate spacers 720 may include a single layer or a multilayer structure. In some embodiments, gate spacers 720 may have a thickness of few nanometers.

Epitaxial source/drain features 745P and 745N are disposed in or over fins 735. For example, semiconductor material is epitaxially grown on fins 735, forming epitaxial source/drain features 745P and 745N. In some embodiments, epitaxial source/drain features 745P and 745N are formed over the source/drain regions of fins 735 after a fin recess process (for example, an etch back process), such that epitaxial source/drain features 745P and 745N are grown from recessed fins 735. In some embodiments, epitaxial source/drain features 745P and 745N wrap the source/drain regions of fins 735. In such embodiments, fins 735 may not be subjected to a fin recess process. As illustrated in FIGS. 7C and 7D, epitaxial source/drain features 745P and 745N can extend (grow) laterally along the y-direction (in some embodiments, substantially perpendicular to fins 735), such that epitaxial source/drain features 745P and 745N are merged epitaxial source/drain features that span more than one fin. For example, in the depicted embodiment, epitaxial source/drain feature 745P spans two fins 735P; and epitaxial source/drain feature 745N spans two fins 735N. In some other embodiments, epitaxial source/drain features 745P and 745N may not be merged in the y-direction. Epitaxial source/drain features 745P and 745N are doped with N-type dopants and/or P-type dopants. In some embodiments, epitaxial source/drain features 745P and 745N include materials and/or dopants that achieve desired tensile stress and/or compressive stress in the channel region.

In some embodiments, silicide layers are formed on epitaxial source/drain features 745P and 745N. In some embodiments, the silicide layers include nickel silicide, titanium silicide, or cobalt silicide. In some embodiments, the silicide layers 725 and epitaxial source/drain features 745P and 745N are collectively referred to as the epitaxial source/drain features of device 700.

One or more dielectric layers are disposed over substrate 705, such as interlayer dielectric (ILD) layer 795. ILD layer 795 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK® (Dow Chemical, Midland, Mich.), polyimide, other low-k dielectric material, or combinations thereof. ILD layer 795 can include a multilayer structure having multiple dielectric materials. Device-level contacts 715A-715E are disposed in ILD layer 795 provide connection to the respective feature. In the depicted embodiment, contacts 715A-715D are source/drain contacts and contact 715E is a gate contact. Device-level contacts 715A-715E include any suitable electrically conductive material, such as Ta, Ti, Al, Cu, Co, W, TiN, TaN, other suitable conductive materials, or combinations thereof. Various conductive materials can be combined to provide device-level contacts 715A-715E with various layers, such as a barrier layer, an adhesion layer, a liner layer, a bulk layer, other suitable layer, or combinations thereof. In some embodiments, device-level contacts 715A-715E include Ti, TiN, or other suitable materials.

Overlying the device 700, metal lines and interposing vias may be formed between/through different ILD layers to work with the device-level contacts to electrically couples various devices (for example, transistors, resistors, capacitors, and/or inductors) and/or components (for example, gate structures and/or source/drain features) of the device 700, such that the various devices and/or components can operate as specified by design requirements of the device 700 and/or the IC it is contained within such as the IC 100.

Figure 8:
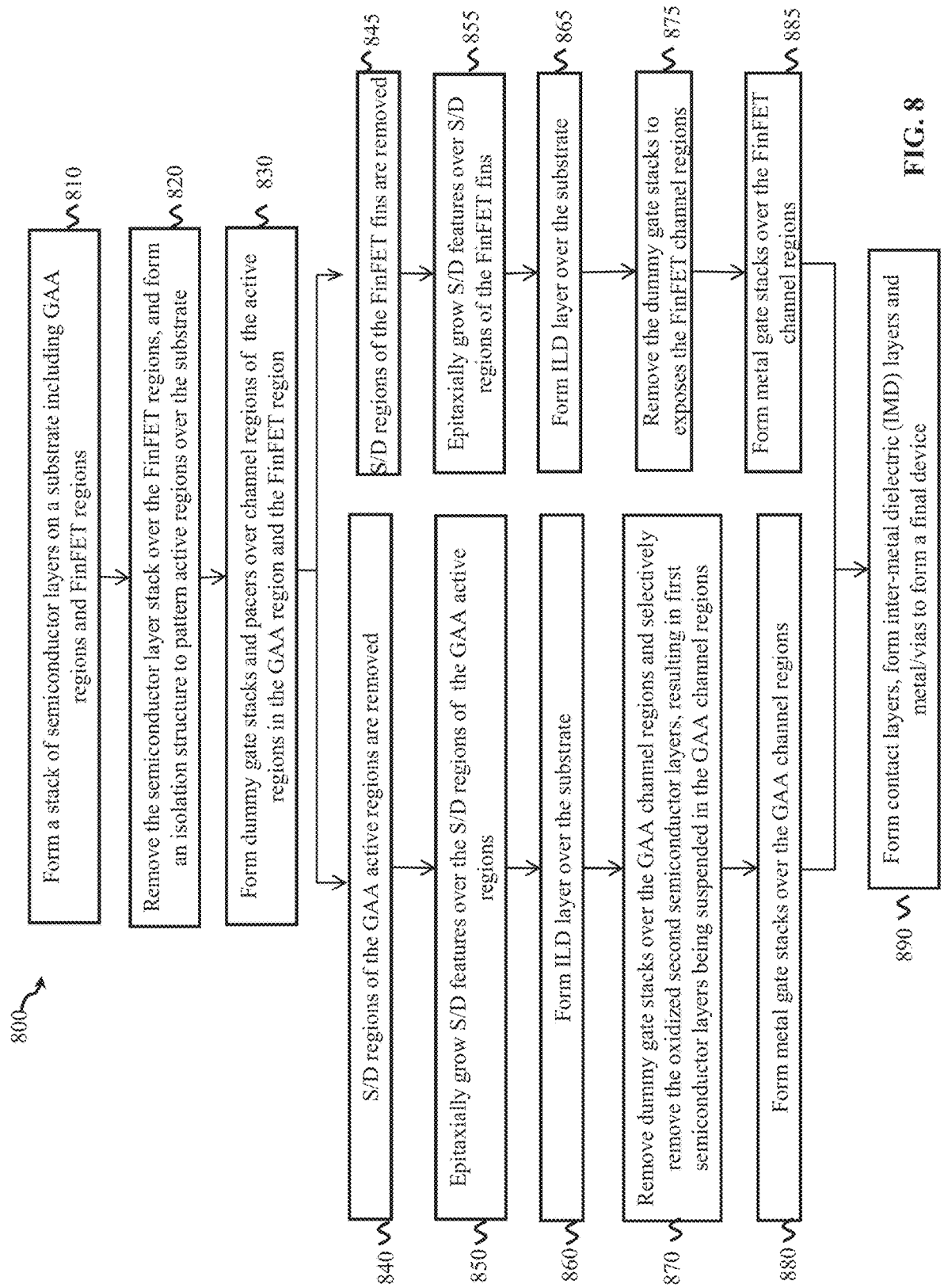
FIG. 8 is a flow chart of a method forming a semiconductor device, according to various aspects of the present disclosure.

FIG. 8 is a flow chart of a method 800 for fabricating an integrated circuit, for example, the IC 100 in FIG. 1, according to various aspects of the present disclosure. The method 800 is merely an example and is not intended to limit the present disclosure beyond what is explicitly recited in the claims. Additional operations can be provided before, during, and after the method 800, and some operations described can be replaced, eliminated, or moved around for additional embodiments of the method.

At operation 810, a substrate is provided, and a stack of semiconductor layers are formed over the substrate. The substrate may be substantially similar to the substrates 505, 605, and/or 705 as discussed above. The substrate comprises regions for GAA transistors (i.e. GAA regions, for example, the GAA region 106 including the first group circuit 110 and the second group circuit 120 as depicted in FIG. 1) and regions for FinFETs (i.e. FinFET regions, for example, the FinFET region 107 including the third group circuit 130 in the core area 101 of IC 100 as depicted in FIG. 1, or another FinFET region including the fourth group circuit 140 in the I/O area 105 of IC 100). The closest distance between the boundaries of the GAA regions and the FinFET regions is D, which is at least four (4) times of the gate pitch of the GAA transistors, or four times of the channel pitch of the GAA transistors, or four times of both.

A stack of semiconductor layers comprising different semiconductor materials may be formed over the substrate by suitable processes. The different materials of the semiconductor layers may be chosen based on providing differing oxidation rates and/or etch selectivity. In the depicted embodiment, semiconductor layers comprising different semiconductor materials (for example, a first semiconductor layer including Si and a second semiconductor layer including SiGe) are alternately grown on the substrate by an epitaxy grown process.

At operation 820, portions of the semiconductor layer stack in the FinFET region is removed by various process, including lithography and etching. For example, a masking element is formed over the substrate through a photolithography process. The mask element exposes the FinFET regions and covers the GAA regions. Subsequently, the semiconductor layer stack in the FinFET regions is etched through the masking element. The etching processes may include one or more dry etching processes, wet etching processes, and other suitable etching techniques.

Additional silicon material may be epitaxially grown in the FinFET region of the substrate after removal of the semiconductor layer stack. The FinFET region may be located in the core area and/or the I/O area of the IC as illustrated in FIG. 1. The GAA region may be located in the core area of the IC as illustrated in FIG. 1. A distance between the FinFET region in the core area and the GAA region in the core area is at least four time of the CPP (gate pitch) of the GAA transistors, at least four times of the channel pitch of the GAA transistors, or at least four time of both the CPP (gate pitch) and channel pitch of the GAA transistors.

Still at operation 820, an isolation feature (for example, isolation feature 575, 675, and 775 (STI)) is formed to pattern the active regions over the substrate. In some embodiments, one masking element may be used to pattern the active regions (fin-like features of the stack of semiconductor materials) in the GAA region as well as the fin active regions in the FinFET region. The active regions may be defined according to a layout shown in FIGS. 2, 3, 4, 5A, 6A, and 7A, or according to other layout diagrams. In some other embodiments, different masking elements are used to form the active regions in the GAA region and/or the FinFET region. The etching process may comprise a dry etching process, a wet etching process, or another suitable etching technique. Subsequently, a layer of dielectric material is deposited over the substrate by chemical vapor deposition (CVD), plasma enhanced CVD (PECVD), physical vapor deposition (PVD), thermal oxidation, or other techniques to form the isolation structure (e.g., STI). A CMP process may be performed to planarize a top surface of the IC. The layer of dielectric material may then be recessed to form the isolation feature, which isolates various active regions of the substrate, for example, extending above the isolation features (e.g., fins of epitaxial grown material in the FinFET region as discussed above and fins of the stack of semiconductor materials in the GAA region, as discussed above).

GAA transistors and FinFET transistors may then be separately formed in different regions, i.e. GAA regions and FinFET regions, of the substrate. In some embodiments, some of the processes, for example, operations 830 or 890 may be performed together in GAA regions and FinFET regions. Other processes, for example, operations 840-880 and operations 845-885 are performed separately in different regions. When processes (operations 840-880) are performed in GAA regions, a mask element is applied to cover the FinFET regions; when processes (operations 845-885) are performed in FinFET regions, a mask element is applied to cover the GAA regions. In some other embodiments, all following processes are performed separately in GAA regions and FinFET regions. For example, operations 830, 840-880, and 890 are performed in GAA regions while FinFET regions are covered by a mask; or, operations 830, 845-885, and 890 are performed in FinFET regions while GAA regions are covered by a mask. In further some embodiments, some of the separated processes in FIG. 9 may be combined and performed together in different regions. For example, operations 850 and 855 may be combined and performed together in GAA regions and FinFET regions. Operations 860 and 865 may be combined and performed together in GAA regions and FinFET regions. Details of these operations will be discussed in the following portion of the present disclosure.

At operation 830, dummy gate stacks and spacers are formed over the channel regions of the active regions of the transistors in the GAA regions and/or the FinFET regions (for example, the position where the gate structures 530, 630, and 730 are located). The dummy gate stacks, including single or multiple layers of materials, engages the fins at the channel region. In some embodiments, a poly layer may be formed by suitable deposition processes such as low-pressure chemical vapor deposition (LPCVD) and PECVD. An etch stop layer and/or a hard mask layer each may be formed over the poly layer by chemical oxidation, thermal oxidation, atomic layer deposition (ALD), CVD, and/or other suitable methods. A length of the dummy gate stacks defined in the x-direction is different in GAA regions and in FinFET regions. For example, a gate length in the GAA regions is less than 20 nm, and a gate length in the FinFET region is larger than 30 nm. In some embodiments, a gate length ratio of the dummy gate stacks in the FinFET region and the GAA region is greater than 1.5.

Thereafter, gate spacers (for example, spacers 520, 620, and/or 720) and gate end dielectric structures (for example, gate end dielectric structures 540, 640) are formed along the sidewalls of the dummy gate stacks. A spacer layer is deposited over the device, covering the various features thereon. The spacer layer is then etched by an anisotropic etching process. Portions of the spacer layer on the sidewall surfaces of the dummy gate stack substantially remain and become the gate spacers. Portions of the spacer layer at the ends of the dummy gate stack substantially remain and become the gate end dielectric structures.

At operation 840, portions of semiconductor layer stack in the source/drain regions of the GAA active regions are removed. The portions of semiconductor layer stack in the source/drains may be etched through an opening of a mask element to form trenches in the source/drain regions of the GAA active regions. The mask element is then removed and portion of the semiconductor layer stack in the channel regions of the GAA active regions are exposed.

At operation 845, portions of the source/drain regions of the FinFET fins are removed. A mask element exposing only the source/drain regions of the FinFET fins is formed over the substrate. The source/drain regions of the FinFET fins are then removed through the mask element by any suitable etching process, including wet etching, dry etching, or combinations thereof.

At operations 850 and 855, epitaxy source/drain features are grown over the source/drain regions of GAA active regions and/or FinFET active regions, respectively. The epitaxy source/drain features grown over the source/drain regions of GAA active regions may be referred to as the source/drain features 545 of device 500 and/or source/drain features 645 of device 600; and the epitaxy source/drain features grown over the source/drain regions of FinFET fins may be referred to as the source/drain features 745 of device 700. An epitaxy process can implement CVD deposition, MBE processes, other suitable SEG processes, or combinations thereof. The epitaxy process can use gaseous and/or liquid precursors, which interact with the composition of the fins/active regions. In some embodiments, epitaxial source/drain features are doped during deposition by adding impurities to a source material of the epitaxy process. In some embodiments, epitaxial source/drain features are doped by an ion implantation process subsequent to a deposition process. In some embodiments, annealing processes are performed to activate dopants in the epitaxial source/drain features.

In some embodiments, silicide layers (for example, silicide layers 525, 625, and 725) are formed over the epitaxy source/drain features. For example, silicide layers are formed by depositing a metal layer over the epitaxial source/drain features. An annealing process is then applied to cause constituents of epitaxial S/D features to react with the metal layer, so that the silicide layers include metal and a constituent of epitaxial S/D features. Any un-reacted metal, such as remaining portions of the metal layer, is selectively removed by any suitable process, such as an etching process.

At operations 860 and 865, an ILD layer is formed in the GAA regions and/or the FinFET regions over the substrate. The ILD layer may be referred to as the ILD layer 595, 695, and 795 for device 500, 600, and 700, respectively. The ILD layer may be deposited by a PECVD process, a flowable CVD (FCVD) process, or other suitable deposition technique. In an embodiment, after the ILD layer are deposited, a CMP process is performed to planarize a top surface of the IC, which may also remove the hard mask layers and the etch stop layers of the dummy gate stacks. As a result, the poly layers of the dummy gate stacks are exposed from a top surface of the IC.

At operation 870, in the GAA regions, portions of the dummy gate stacks over the GAA channel regions (for example, in the place of 530S, 530W, 630S, 630S', 630W, and 630W') are removed to form an opening in place of the dummy gate stacks between the gate spacers. The GAA channel regions, i.e. the semiconductor layer stack comprising the first semiconductor layers (for example, including Si) and the second semiconductor layers (for example, including SiGe), are then exposed in the opening.

In the depicted embodiments, the dummy gate stacks between the different type of GAA cells, (for example, in place of the dummy gate structures 530D or 630D between the Nanosheet cell and the Nanowire cell) are also removed to form trenches therein. Dielectric material may then be disposed in the trenches to form the dielectric isolation structures, (for example, the isolation structures 270 or 470 in FIG. 2 or 4, respectively) to isolate of the adjacent GAA cells.

Still at operation 870, portions of the second semiconductor layers (for example, including SiGe) are removed through the opening. An oxidation process may be applied to the second semiconductor layers (for example, semiconductor layers including SiGe) of the exposed semiconductor layer stack in the channel regions of the GAA active regions. In some other embodiments, the oxidation process is a selective oxidation due to the different oxidation rates of the different materials of the semiconductor layers. Therefore, the semiconductor layers in the channel regions of the GAA active regions comprises alternating semiconductor layers including alternating materials, such as Si and SiGeOx, in different layers. The oxidized second semiconductor layers are then removed by a selective etching process. As a result, portions of the first semiconductor layers (for example, including Si) in the GAA channel regions are suspended in the opening. The suspended first semiconductor layers referred to as the channel semiconductor layers 515 and 615 for device 500 and 600, respectively. As discussed above, the widths of the Nanosheet channel semiconductor layers and Nanowire channel semiconductor layers are different. In some embodiments, the width of the Nanosheet channel semiconductor layers is about 1.3 to about 10 times of the Nanowire channel semiconductor layers. In some further embodiments, the width of the Nanosheet channel semiconductor layers is about 1.5 to about 4 times of the Nanowire channel semiconductor layers.

At operation 875, in the FinFET region, portions of the dummy gate stacks over the FinFET channel regions (for example, in the place of 730P, 730N) are removed (for example, by etching) to form openings therein.

At operation 880, GAA gate stacks are formed over the channel region of GAA active regions (for example, in the place of 530S, 530W, 630S, 630S', 630W, and 630W'). The GAA gate stacks fill the channel regions and wraps around each of the suspended channel semiconductor layers in the channel regions of GAA active regions. In some embodiments, first, dielectric layers (may be referred to as the dielectric layers of 590 and 690 of device 500 and 600, respectively) may be formed by chemical oxidation, thermal oxidation, ALD, CVD, and/or other suitable methods. In some embodiments, a thickness of the gate dielectric layer of the GAA gate stacks is less than about 3 nm. Subsequently, gate electrodes (may be referred to as the gate electrodes 585 and 685) including a work function layer, a metal fill layer, and some other layers may be deposited to wrap around the dielectric layers and further wrap around the channel semiconductor layers. The work function layer may be deposited by CVD, PVD, and/or other suitable process. The metal fill layer may be formed by CVD, PVD, plating, and/or other suitable processes. Thereafter, a hard mask layer (may be referred to as the hard mask layers 580 and 680) is then deposited over the gate stacks. A CMP process is then performed to planarize a top surface of the IC.

In operation 885, FinFET gate stacks are formed in the gate openings over the FinFET channel regions (for example, in the place of 730P and 730N of device 700). The FinFET gate stacks fills the openings in the FinFET channel regions. In some embodiments, a dielectric layer may be formed by chemical oxidation, thermal oxidation, ALD, CVD, and/or other suitable methods. In some embodiments, a thickness of the gate dielectric layer of the FinFET gate stacks in the core area of IC is substantially equal to the thickness of the gate dielectric layer of the GAA gate stacks. For example, the thickness of the gate dielectric layer of the FinFET gate stacks in the core area is less than about 3 nm. In some embodiments, a thickness of the gate dielectric layer of the FinFET gate stacks in the I/O area of IC is thicker than the thickness of the gate dielectric layer of the GAA gate stacks or FinFET gate stacks in the core area of IC. For example, the thickness of the gate dielectric layer of the FinFET gate stacks in the I/O area is more than about 4 nm. In other words, the thickness of the gate dielectric layer of the FinFET in the I/O area is more than 1.3 times of the gate dielectric of the transistors (FinFET, Nanosheet or Nanowire transistors) in the core area.

Subsequently, gate electrodes (may be referred to as the gate electrodes 785P and 785N of device 700) including a work function layer, a metal fill layer, and some other layers may be deposited by CVD, PVD, plating, and/or other suitable processes. A hard mask layer may then be deposited over the gate stacks by chemical oxidation, thermal oxidation, ALD, CVD, and/or other suitable methods. A CMP process is then performed to planarize a top surface of the IC. The CMP process after formation of the FinFET gate stacks may be combined with the CMP process after formation of the GAA gate stacks.

At operation 890, further processes are performed to complete the fabrication of the IC. For example, it may form contact openings, contact layers in the source/drain regions, as well as various contacts (for example, contacts 550, 650, 750), vias (for example, gate vias 560 and source/drain vias 570), wires, and multilayer interconnect features (e.g., metal layers and interlayer dielectrics) over the substrate, configured to connect the various features to form a functional circuit. Multiple lithography, etching, and deposition steps may be involved in the operation of 890.

Although not intended to be limiting, one or more embodiments of the present disclosure provide many benefits to an integrated circuit and a formation process thereof. For example, embodiments of the present disclosure provide an IC design integrated long channel devices (for example FinFET devices) and different short channel devices (for example, Nanosheet and/or Nanowire devices) in one chip. The mixture of the long channel devices and short channel devices can provide design flexibility for speed and power optimization. In addition, using long channel devices in a design comprising short channel devices can help with the process margin improvement.

The present disclosure provides for many different embodiments. Integrated circuit having an integration layout and methods of fabrication thereof are disclosed herein. An exemplary integrated circuit includes a first cell including one or more first type gate-all-around (GAA) transistors located in a first region of the integrated circuit. The integrated circuit also includes a second cell including one or more second type GAA transistors located in the first region of the integrated circuit, wherein the second cell is disposed adjacently to the first cell, wherein the first type GAA transistors are one of nanosheet transistors or nanowire transistors and the second type GAA transistors are the other one of nanosheet transistors or nanowire transistors. And, the integrated circuit also includes a third cell including one or more fin-like field effect transistors (FinFETs) located in a second region of the integrated circuit, wherein the second region is disposed a distance from the first region of the integrated circuit.

In some embodiments, the distance between the first region and the second region of the integrated circuit is at least four times of a gate pitch of the first or second type GAA transistors, or at least four times of a channel pitch of the first or second type GAA transistors, or at least four times of both the gate pitch and the channel pitch of the first or second type GAA transistors.

In some embodiments, an isolation structure is disposed between the first cell and the second cell disposed adjacent in a first row of cells in the first region of the integrated circuit. In a further embodiment, the integrated circuit further comprises a second row of cells including a plurality of cells each having one or more first type GAA transistors, and the second row of cells is abutted to the first row of cells in the integrated circuit.

In some other embodiments, the first cell including one or more first type GAA transistors and the second cell including one or more second type GAA transistors are arranged in different rows of cell, respectively, in the first region of the integrated circuit, and the different rows of cell are abutted together in the first region of the integrated circuit.

In some embodiments, an isolation structure is disposed in the distance between the first region and the second region of the integrated circuit.

In some embodiments, a channel semiconductor layer of the one or more first type GAA transistors has a first width, a channel semiconductor layer of the one or more second type GAA transistors has a second width, wherein a ratio of the first width to the second width is about 1.3 to about 10.

In some embodiments, the first cell or the second cell is one of a NAND gate, a NOR gate, an AND gate, an OR gate, a NOT gate, an XOR gate, an XNOR gate, a Flip-Flop, or a latch.

In some embodiments, a channel semiconductor layer of the one or more first type GAA transistors has a first thickness, a channel semiconductor layer of the one or more second type GAA transistors has a second thickness, wherein the first thickness is substantially equal to the second thickness.

In some embodiments, a ratio of a gate length of the FinFETs in the third cell to a gate length of the first type GAA transistors in the first cell or a gate length of the second type GAA transistors in the second cell is greater than or equal to about 1.5.

In some embodiments, a gate length of the one or more FinFETs in the third cell is larger than about 30 nm, and a gate length of the one or more first type GAA transistors in the plurality of first cells or a gate length of the one or more second type GAA transistors in the plurality of second cells is less than about 20 nm.

Another integrated circuit comprises a first circuit including one or more first type gate-all-around (GAA) transistors formed in a GAA region in a core area of a substrate and a second circuit including one or more second type GAA transistors formed in the GAA region in the core area of the substrate, wherein the second circuit is disposed adjacent to the first circuit. The integrated circuit also comprises a third circuit including one or more fin-like field effect transistors (FinFETs) formed in a FinFET region in the core area of the substrate, wherein the FinFET region is disposed a distance from the GAA region. And, the integrated circuit further comprises a fourth circuit including one or more FinFETs formed over an input/output (I/O) area of the substrate.

In some embodiments, a thickness of a gate dielectric layer of the one or more first type GAA transistors in the first circuit, a thickness of a gate dielectric layer of the one or more second type GAA transistors in the second circuit, and a thickness of a gate dielectric layer of the one or more FinFETs in the third circuit are substantially the same. And, a thickness of a gate dielectric layer of the one or more FinFETs in the fourth circuit is thicker than the thickness of the gate dielectric layer of the transistors in the first circuit.

In some further embodiments, the distance between the FinFET region and the GAA region is at least four times of a gate pitch of the first or the second type GAA transistors, or at least four times of a channel pitch of the first or the second type GAA transistors, or at least four times of both the gate pitch and the channel pitch of the first or the second type GAA transistors.

In yet some further embodiments, the gate pitch of adjacent first or second type GAA transistors are substantially the same, or the channel pitch of adjacent first or second type GAA transistors are substantially the same in the core area of the substrate.

An exemplary method for forming an integrated circuit comprises forming a stack of semiconductor layers over a substrate, wherein the stack of semiconductor layers includes a first semiconductor layer of a first semiconductor material and a second semiconductor layer of a second semiconductor material, the second semiconductor material being different than the first semiconductor material. The method also comprises removing a portion of the stack of semiconductor layers through a photoresist mask to form a fin-like field effect transistor (FinFET) region over the substrate, wherein a remained portion of the stack of semiconductor layers forms a gate-all-around (GAA) region over the substrate, the FinFET region is formed a distance from the GAA region. The method further comprises forming a first type GAA cell including a first type GAA transistor and a second type GAA cell including a second type GAA transistor in the GAA region, wherein each of the first type GAA transistor and the second type GAA transistor includes a channel region formed by a portion of the first semiconductor layer of the stack of semiconductor layers; and forming a FinFET cell including a FinFET in the FinFET region.

In some embodiments, the distance between the FinFET region and the GAA region is at least four times of a gate pitch of the first or the second type GAA transistor, or at least four times of a channel pitch of the first or the second type GAA transistor, or at least four times of both the gate pitch and the channel pitch of the first or the second type GAA transistor.

In some embodiments, forming a first type GAA cell and a second type GAA cell in the GAA region includes forming the first type GAA cell and the second type GAA cell adjacently in a first row of cells, wherein an isolation structure is disposed between the first type GAA cell and the second type GAA cell.

In some further embodiments, forming a first type GAA cell and a second type GAA cell in the GAA region also includes forming only the first type GAA cell or only the second type GAA cell in a second row of cells, wherein the second row of cells is abutted to the first row of cells.

In some other embodiments, forming a first type GAA cell and a second type GAA cell in the GAA region includes forming a first row of cells including the first type GAA cells and not the second type GAA cells; and forming a second row of cells including the second type GAA cells and not the first type GAA cells, wherein the second row of cells is abutted to the first row of cells.

The foregoing outlines features of several implementations so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the implementations introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first cell including first gate-all-around (GAA) transistors located in a first region of the integrated circuit;
   a second cell including second GAA transistors located in the first region of the integrated circuit, wherein the second cell is disposed directly adjacent to the first cell, the first GAA transistors have first channel semiconductor layers having a first width, and the second GAA transistors have second channel semiconductor layers have a second width that is different than the first width; and
   a third cell including fin-like field effect transistors (FinFETs) located in a second region of the integrated circuit, wherein the second region of the integrated circuit does not share an interface with the first region of the integrated circuit and a distance between the second region of the integrated circuit and the first region of the integrated circuit is equal to at least four times a first gate pitch of the first GAA transistors or a second gate pitch of the second GAA transistors.

2. The integrated circuit of claim 1, wherein the first gate pitch of the first GAA transistors is equal to the second gate pitch of the second GAA transistors.

3. The integrated circuit of claim 1, wherein the distance between the second region of the integrated circuit and the first region of the integrated circuit is further equal to at least four times a first channel pitch of the first GAA transistors or a second channel pitch of the second GAA transistors.

4. The integrated circuit of claim 3, wherein the first channel pitch of the first GAA transistors is the same as the second channel pitch of the second GAA transistors.

5. The integrated circuit of claim 1, wherein the first region and the second region are located in a core area of the integrated circuit.

6. The integrated circuit of claim 1, wherein the first region is located in a core area of the integrated circuit and the second region is located in an input/output area of the integrated circuit.

7. The integrated circuit of claim 1, wherein a ratio of the first width to the second width is about 1.3 to about 10.

8. The integrated circuit of claim 1, wherein:
   the first region includes a p-well and an n-well disposed in a substrate, wherein the n-well is directly adjacent to the p-well;
   the first GAA transistors include a first n-type GAA transistor disposed over the p-well and a first p-type GAA transistor disposed over the n-well; and
   the second GAA transistors include a second n-type GAA transistor disposed over the p-well and a second p-type GAA transistor disposed over the n-well.

9. The integrated circuit of claim 1, wherein:
   the first region includes an n-well, a first p-well, and a second p-well disposed in a substrate, wherein the n-well is disposed directly between the first p-well and the second p-well;
   the first GAA transistors include a first n-type GAA transistor disposed over the first p-well and a first p-type GAA transistor disposed over the n-well; and
   the second GAA transistors include a second n-type GAA transistor disposed over the second p-well and a second p-type GAA transistor disposed over the n-well.

10. The integrated circuit of claim 1, wherein a first ratio of a gate length of the FinFETs to a gate length of the first GAA transistors is at least about 1.5, and a second ratio of the gate length of the FinFETs to a gate length of the second GAA transistors is at least about 1.5.

11. The integrated circuit of claim 1, wherein a gate length of the FinFETs in the third cell is greater than about 30 nm, a gate length of the first GAA transistors is less than about 20 nm, and a gate length of the second GAA transistors is less than about 20 nm.

12. An integrated circuit comprising:
a first circuit including first gate-all-around (GAA) transistors formed in a GAA region in a core area of a substrate;
a second circuit including second GAA transistors formed in the GAA region in the core area of the substrate, wherein the second circuit is disposed directly adjacent to the first circuit, the second circuit is isolated from the second circuit by a dummy isolation gate structure, the first GAA transistors have first channel layers having a first configuration, and the second GAA transistors have second channel layers having a second configuration that is different than the first configuration;
a third circuit including fin-like field effect transistors (FinFETs) formed in a FinFET region in the core area of the substrate, wherein the FinFET region is disposed a distance from the GAA region, such that the FinFET region does not share an interface with the GAA region; and
a fourth circuit including FinFETs formed over an input/output (I/O) area of the substrate.

13. The integrated circuit of claim 12, wherein a first thickness of a first gate dielectric layer of the first GAA transistors in the first circuit, a second thickness of a second gate dielectric layer of the second GAA transistors in the second circuit, and a third thickness of a third gate dielectric layer of the FinFETs in the third circuit are substantially the same; and
a fourth thickness of a fourth gate dielectric layer of the one or more FinFETs in the fourth circuit is thicker than the first thickness of the first gate dielectric layer of the first GAA transistors in the first circuit.

14. The integrated circuit of claim 12, wherein the distance between the FinFET region and the GAA region is equal to at least four times a first gate pitch of the first GAA transistors or a second gate pitch of the second GAA transistors.

15. The integrated circuit of claim 12, wherein the distance between the FinFET region and the GAA region is at least four times a first channel pitch of the first GAA transistors or a second channel pitch of the second GAA transistors.

16. A method for forming an integrated circuit, comprising:
forming a stack of semiconductor layers over a substrate, wherein the stack of semiconductor layers includes a first semiconductor layer of a first semiconductor material and a second semiconductor layer of a second semiconductor material, the second semiconductor material being different than the first semiconductor material;
removing a portion of the stack of semiconductor layers through a photoresist mask to form a fin-like field effect transistor (FinFET) region over the substrate, wherein a remaining portion of the stack of semiconductor layers forms a gate-all-around (GAA) region over the substrate, and further wherein the FinFET region is formed a distance from the GAA region and does not share an interface with the GAA region;
forming a first GAA cell including first GAA transistors and a second GAA cell including second GAA transistors in the GAA region, wherein the second GAA cell is disposed directly adjacent to the first GAA cell, the first GAA transistors have first channel semiconductor layers having a first width formed by a first portion of the first semiconductor layer of the stack of semiconductor layers, the second GAA transistors have second channel semiconductor layers having a second width formed by a second portion of the first semiconductor layer of the stack of semiconductor layers, and further wherein the second width is different than the first width and the distance between the FinFET region and the GAA region is equal to at least four times a first gate pitch of the first GAA transistors or a second gate pitch of the second GAA transistors; and
forming a FinFET cell including a FinFET in the FinFET region.

17. The method of claim 16, wherein the distance between the FinFET region and the GAA region is further equal to at least four times a first channel pitch of the first GAA transistors or a second channel pitch of the second GAA transistors.

18. The method of claim 16, wherein the forming the first GAA cell and the second GAA cell in the GAA region comprises:
forming the first GAA cell and the second GAA cell in a same row of cells, wherein an isolation structure is disposed between the first GAA cell and the second GAA cell.

19. The method of claim 16, wherein the forming the first GAA cell and the second GAA cell in the GAA region further comprises:
forming the first GAA cell in a first row of cells and the second GAA cell in a second row of cells, wherein the second row of cells is abutted to the first row of cells, such that the second GAA cell is disposed directly adjacent to the first GAA cell.

20. The method of claim 19, wherein the first row of cells includes only first GAA cells and the second row of cells includes only second GAA cells.

* * * * *